United States Patent
Takahashi et al.

(10) Patent No.: US 12,080,909 B2
(45) Date of Patent: Sep. 3, 2024

(54) FLEXIBLE PRINTED CIRCUIT, WIRING MEMBER, POWER STORAGE MODULE, AND CONNECTION MODULE

(71) Applicants: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

(72) Inventors: Hideo Takahashi, Mie (JP); Shinichi Takase, Mie (JP); Hideaki Nakajima, Mie (JP)

(73) Assignees: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

(*) Notice: Subject to any disclaimer, the term of this patent is extended or adjusted under 35 U.S.C. 154(b) by 764 days.

(21) Appl. No.: 17/275,965

(22) PCT Filed: Sep. 11, 2019

(86) PCT No.: PCT/JP2019/035668
§ 371 (c)(1),
(2) Date: Mar. 12, 2021

(87) PCT Pub. No.: WO2020/071070
PCT Pub. Date: Apr. 9, 2020

(65) Prior Publication Data
US 2021/0408633 A1   Dec. 30, 2021

(30) Foreign Application Priority Data
Oct. 2, 2018   (JP) ................. 2018-187563

(51) Int. Cl.
*H05K 1/11* (2006.01)
*H01M 10/48* (2006.01)
(Continued)

(52) U.S. Cl.
CPC ......... *H01M 50/298* (2021.01); *H01M 10/48* (2013.01); *H01M 10/482* (2013.01);
(Continued)

(58) Field of Classification Search
CPC .............................. H05K 1/11; H05K 1/0393
See application file for complete search history.

(56) References Cited

U.S. PATENT DOCUMENTS

| | | |
|---|---|---|
| 9,024,572 B2 | 5/2015 | Nishihara et al. |
| 2013/0000957 A1 | 1/2013 | Ikeda et al. |
| 2018/0108898 A1 | 4/2018 | Shoji et al. |

FOREIGN PATENT DOCUMENTS

| | | |
|---|---|---|
| JP | 2010-157399 | 7/2010 |
| JP | 2011-228217 | 11/2011 |

(Continued)

OTHER PUBLICATIONS

English translation of JP 2017/059481 (Year: 2017).*
(Continued)

*Primary Examiner* — Jeremy C Norris
(74) *Attorney, Agent, or Firm* — GREENBLUM & BERNSTEIN, P.L.C.

(57) ABSTRACT

A flexible printed circuit includes a plurality of conductive paths to which connection protruding portions of connection protruding pieces protruding from conductive members to be connected to electrode terminals of power storage elements are to be connected. The flexible printed circuit includes a plurality of inlet openings that are larger in size than the external shapes of the connection protruding portions and into which the connection protruding portions can (Continued)

be inserted with a gap being formed around each protruding portion, and a plurality of entrance openings that are provided corresponding to the inlet openings, have a configuration in which the protruding portions can be moved thereinto from the inlet openings, and extend in the form narrower than the inlet openings. Each of the conductive paths includes a land that is located at an edge portion of the entrance opening and to which the connection protruding portion is to be connected.

20 Claims, 25 Drawing Sheets

(51) Int. Cl.
*H01M 50/209* (2021.01)
*H01M 50/284* (2021.01)
*H01M 50/298* (2021.01)
*H01M 50/50* (2021.01)
*H01M 50/519* (2021.01)
*H01M 50/55* (2021.01)
*H01M 50/553* (2021.01)
*H05K 1/02* (2006.01)

(52) U.S. Cl.
CPC ....... *H01M 50/209* (2021.01); *H01M 50/284* (2021.01); *H01M 50/50* (2021.01); *H01M 50/519* (2021.01); *H01M 50/55* (2021.01); *H01M 50/553* (2021.01); *H05K 1/028* (2013.01); *H05K 1/11* (2013.01)

(56) References Cited

FOREIGN PATENT DOCUMENTS

| JP | 5621765 | 11/2014 | |
|---|---|---|---|
| JP | 2017/059481 | * 3/2017 | ............. H01M 2/10 |
| JP | 2018-067387 | 4/2018 | |

OTHER PUBLICATIONS

Official Communication issued in International Bureau of WIPO Patent Application No. PCT/JP2019/035668, dated Nov. 26, 2019, along with an English translation thereof.

* cited by examiner

FLEXIBLE PRINTED CIRCUIT, WIRING MEMBER, POWER STORAGE MODULE, AND CONNECTION MODULE

TECHNICAL FIELD

The technology disclosed in this specification relates to a flexible printed circuit, a wiring member, a power storage module, and a connection module.

BACKGROUND ART

For example, the battery module disclosed in Japanese Patent No. 5621765 (Patent Document 1) is known as a battery module including a voltage detection circuit for detecting a voltage between battery cells. The voltage detection circuit of this battery module is formed by arranging, on a contact pad formed on a flexible printed circuit (FPC), a connection member provided on a coupling bus bar connected to terminals of the adjacent battery cells and then connecting the connection member to the contact pad through reflow soldering.

CITATION LIST

Patent Document

Patent Document 1: Japanese Patent No. 5621765

SUMMARY OF INVENTION

Technical Problem

In the case of this type of voltage detection circuit, a plate-like connection portion having a flat plate shape provided on a conductive member (corresponding to the bus bar) is arranged on a land (corresponding to the contact pad of the FPC) and soldered thereto, and therefore, an additional positioning means such as a positioning jig for preventing a positional misalignment of the plate-like connection portion relative to the land is needed. In addition, even if the plate-like connection portion is precisely arranged on the land, a positional misalignment of the flexible printed circuit or the wiring member may occur when the land is connected to the plate-like connection portion. However, if a countermeasure is taken against a positional misalignment by connecting the land to the plate-like connection portion after positioning them individually, the operations will become complicated.

This specification discloses a technology for easily suppressing positional misalignments of a flexible printed circuit and a conductive member and easily connecting the flexible printed circuit and the conductive member to each other.

Solution to Problem

A technology disclosed in this specification is a flexible printed circuit with a plurality of conductive paths to which protruding portions protruding from conductive members to be connected to electrode terminals of power storage elements are to be connected, the flexible printed circuit comprising: a plurality of inlet openings that are larger in size than external shapes of the protruding portions and into which the protruding portions can be inserted with a gap being formed around each protruding portion; and a plurality of entrance openings that are provided corresponding to the inlet openings, have a configuration in which the protruding portions can be moved thereinto from the inlet openings, are narrower than the inlet openings, and extend in a plate-face direction of the flexible printed circuit, wherein each of the conductive paths includes a land that is located at an edge portion of the entrance opening and to which the protruding portion is to be connected.

Also, a technology disclosed in this specification is a wiring member including: a plurality of conductive members that each include a main body portion to be connected to an electrode terminal of a power storage element; and a flexible printed circuit including a plurality of conductive paths to which the conductive members can be connected, wherein each of the conductive members includes a protruding portion that protrudes from the main body portion, the flexible printed circuit includes: a plurality of inlet openings that are larger in size than external shapes of the protruding portions and into which the protruding portions can be inserted with a gap being formed around each protruding portion; and a plurality of entrance openings that are provided corresponding to the inlet openings, have a configuration in which the protruding portions can be moved thereinto from the inlet openings, are narrower than the inlet openings, and extend in a plate-face direction of the flexible printed circuit, and each of the conductive paths includes a land that is located at an edge portion of the entrance opening and to which the protruding portion can be connected.

Also, a technology disclosed in this specification is a power storage module including: a power storage element group in which a plurality of power storage elements are lined up; and the wiring member described above.

Also, a technology disclosed in this specification is a wiring module to be attached to a power storage element group in which a plurality of power storage elements each including two electrode terminals are lined up, the wiring module comprising: a plurality of conductive members that each include a main body portion to be connected to the electrode terminal of the power storage element, and a protruding portion that protrudes from the main body portion; a flexible printed circuit including a plurality of conductive paths to which the conductive members are connected; and an alignment member for lining up the plurality of conductive members in a direction in which the power storage elements are lined up, and holding the conductive members, wherein the flexible printed circuit includes: inlet openings that are larger in size than external shapes of the protruding portions and into which the protruding portions can be inserted with a gap being formed around each protruding portion; and entrance openings that are provided in communication with the inlet openings, have a configuration in which the protruding portions inserted into the inlet openings can be moved thereinto, are narrower than the inlet openings, and extend in a plate-face direction of the flexible printed circuit, and each of the conductive paths includes a land that is located at an edge portion of the entrance opening and to which the protruding portion is connected.

With such configurations, by inserting the protruding portions of the conductive members into the inlet openings that are larger in size than the external shapes of the protruding portions and then sliding the flexible printed circuit to move the protruding portions into the entrance openings that are narrower than the inlet openings, the lands and the protruding portions can be positioned.

Accordingly, it is easier to position the lands and the protruding portions compared with the case where plate-like connection portions are arranged on the lands, for example, and the lands provided at the edge portions of the inlet openings can be easily attached to the protruding portions of the conductive members.

When the protruding portions are moved into the entrance openings, the protruding portions are locked to, in an orthogonal direction that is orthogonal to the extension direction of the entrance openings, the edge portions in the orthogonal direction of the entrance openings, and thus the protruding portions of the conductive members can be easily positioned relative to the lands. In addition, compared with the case where plate-like connection portions are arranged on the lands, for example, positional misalignments of the lands and the protruding portions can be suppressed even after the lands and the protruding portions are positioned. Accordingly, the lands are easily connected to the protruding portions via solder or the like.

The technology disclosed in this specification may also be configured as follows.

A configuration may also be employed in which the plurality of entrance openings extend in the same direction from the inlet openings, and thereby all extension directions of the entrance openings are the same.

A configuration may also be employed in which the main body portions are connected to the electrode terminals in a state in which the plurality of the conductive members are lined up, and the plurality of entrance openings extend from the inlet openings in the same direction, and thereby extension directions of the entrance openings are the same as a direction in which the plurality of conductive members are lined up.

A configuration may also be employed in which the plurality of entrance openings extend in the same direction from the inlet openings, and thereby all extension directions of the entrance openings are the same.

With such a configuration, the protruding portions can be simultaneously moved into the entrance openings and positioned by inserting the protruding portions into the plurality of inlet openings and then sliding the flexible printed circuit in the direction in which the power storage elements are lined up.

A configuration may also be employed in which the lands extend in the extension directions of the entrance openings.

With such a configuration, even if some of the protruding portions to be inserted into the plurality of inlet openings and some of the plurality of conductive members are misaligned in the extension direction of the entrance openings, the protruding portions can be connected to the lands. That is, it is possible to inhibit the lands from not being capable of being connected to the protruding portions due to positional misalignments of the lands relative to the protruding portions.

A configuration may also be employed in which a length in an extension direction of each of the lands is set to be larger than a sum of the maximum tolerance of a dimension between the protruding portions adjacent to each other and a length in an extension direction of the protruding portion.

With such a configuration, the length in the extension direction of the land is larger than the sum of the maximum tolerance of the dimensions between the protruding portions to be inserted into the plurality of inlet openings in the extension direction of the entrance openings, and the length in the extension direction of the protruding portion. Therefore, even when gaps between the protruding portions moved into the plurality of inlet openings vary in size due to the attachment tolerance or manufacturing tolerance, for example, it is possible to inhibit the lands from being misaligned in the extension direction relative to the protruding portions and to reliably connect the lands and the protruding portions.

A configuration may also be employed in which a length in an extension direction of each of the lands is set to be larger than a sum of the maximum tolerance of dimensions between the plurality of conductive members and a length in an extension direction of the protruding portion.

With such a configuration, the length in the extension direction of the land is larger than the sum of the maximum tolerance of the dimensions between the plurality of conductive members in the direction in which the conductive members are lined up, and the length in the extension direction of the protruding portion. Therefore, even when the sizes of gaps in the direction in which the plurality of conductive members are lined up vary due to the attachment tolerance or manufacturing tolerance, for example, it is possible to inhibit the lands from being misaligned relative to the protruding portions of the conductive members and to reliably connect the lands and the protruding portions.

A configuration is employed in which the alignment member includes: a first alignment member for lining up the conductive members that connect the electrode terminals located on one of two sides and holding the conductive members; and a second alignment member for lining up the conductive members that connect the electrode terminals on the other of the two sides and holding the conductive members, and a length in an extension direction of each of the lands is set to be larger than a sum of the maximum tolerance of dimensions of the first alignment member and the second alignment member in a direction in which the power storage elements are lined up, and a length in an extension direction of the protruding portion.

With such a configuration, the length in the extension direction of the land are larger than the sum of the maximum tolerance of the dimensions of the first alignment member and the second alignment member and the length of each protruding portion. Therefore, even when the protruding portions of the conductive members held by the first alignment member and the protruding portions of the conductive members held by the second alignment member vary due to the attachment tolerance or manufacturing tolerance, it is possible to inhibit the lands from being misaligned relative to the protruding portions of the conductive members and to reliably connect the lands and the protruding portions.

A configuration may also be employed in which an insertion opening constituted by the entrance opening and the inlet opening is an opening whose opening edge is continuous.

For example, if an insertion opening is formed in the side portion of a flexible printed circuit and the opening edge thereof is not continuous, the strength of a portion of the side portion provided with the opening decreases. As a result, there is a concern that it will be difficult to move the protruding portion into the entrance opening from the inlet opening, and the protruding portion that has been moved into the entrance opening will dislodge from the entrance opening.

However, with the above-described configuration, the opening edge of the insertion opening is continuous, and therefore, it is possible to suppress a decrease in strength of the edge portion of the insertion opening. Accordingly, it is possible to suppress the difficulty of moving the protruding portion into the entrance opening from the inlet opening, and to inhibit the protruding portion that has been moved into the entrance opening from dislodging from the entrance opening.

A configuration may also be employed in which an opening width of each of the entrance openings in an orthogonal direction that is orthogonal to the extension direction of the entrance opening is equal to a length in the orthogonal direction of the protruding portion.

Here, the case where the opening width is equal to the length in the orthogonal direction of the protruding portion encompasses a case where the opening width of the entrance opening is set to be slightly larger than the length of the protruding portion, and a case where the opening width of the entrance opening is set to be slightly smaller than the length of the protruding portion.

With such a configuration, the protruding portions of the conductive members can be arranged close to the lands provided at the edge portions of the entrance openings, thus making it easy to connect the protruding portions to the lands via solder or the like.

A configuration may also be employed in which each of the protruding portions includes an engagement portion that can be fitted to an edge portion of the entrance opening through recess-projection fitting to be locked to the edge portion in a protruding direction.

With such a configuration, when the protruding portion is moved into the entrance opening, the edge portion of the entrance opening and the engagement portion are locked to each other in the protruding direction, thus making it possible to prevent the protruding portion from dislodging from the entrance opening in the protruding direction. That is, it is possible to further inhibit the lands from being misaligned relative to the protruding portions and to reliably connect the lands and the protruding portions.

Advantageous Effects of Invention

With the technology disclosed in this specification, it is possible to easily suppress positional misalignments of the flexible printed circuit and the conductive members and to easily connect the flexible printed circuit and the conductive members to each other.

DESCRIPTION OF EMBODIMENTS

Embodiment 1

Figure 1:
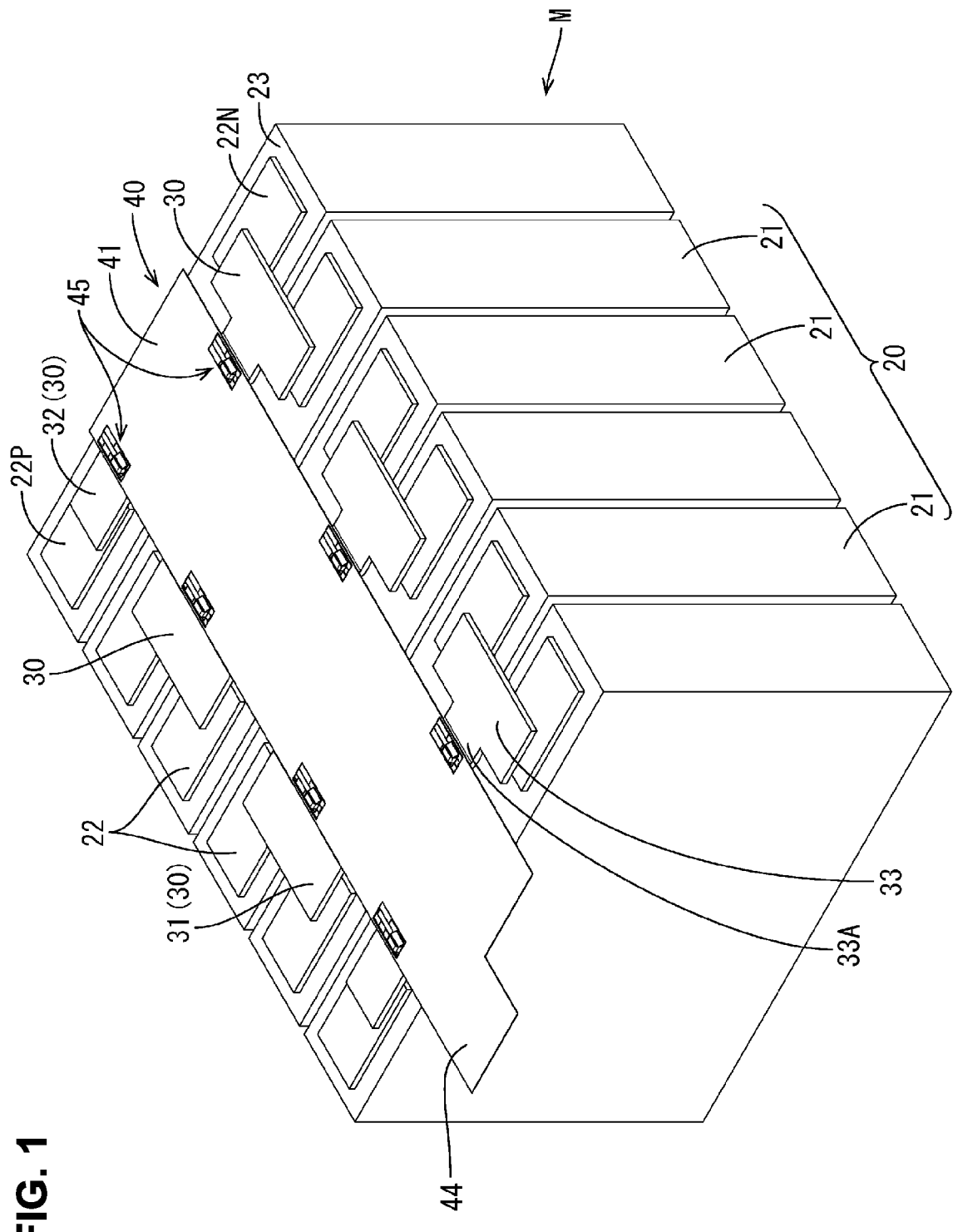
FIG. 1 is a perspective view of a power storage module according to Embodiment 1.

Embodiment 1 of the technology disclosed in this specification will be described with reference to FIGS. 1 to 14.

A power storage module M of this embodiment is used as a driving source for a vehicle such as an electric car or a hybrid car, and includes a power storage element group 20 in which a plurality of power storage elements 21 are lined up, a plurality of conductive members 30 that each have a main body portion 33 connected to an electrode terminal 22 of the power storage element 21, and a flexible printed circuit (also referred to as merely as an "FPC" hereinafter) 40 including a plurality of conductive paths 42 to which the conductive members 30 are connected. In this embodiment, the conductive members 30 and the flexible printed circuit 40 correspond to a wiring member. It should be noted that, in the following description, the front-rear direction is based on the left-right direction in FIGS. 2 and 6, and the F side is taken as the front side and the B side is taken as the rear side. The left-right direction is based on the vertical direction in FIGS. 2 and 6, and the L side is taken as the left side and the R side is taken as the right side.

Figure 2:
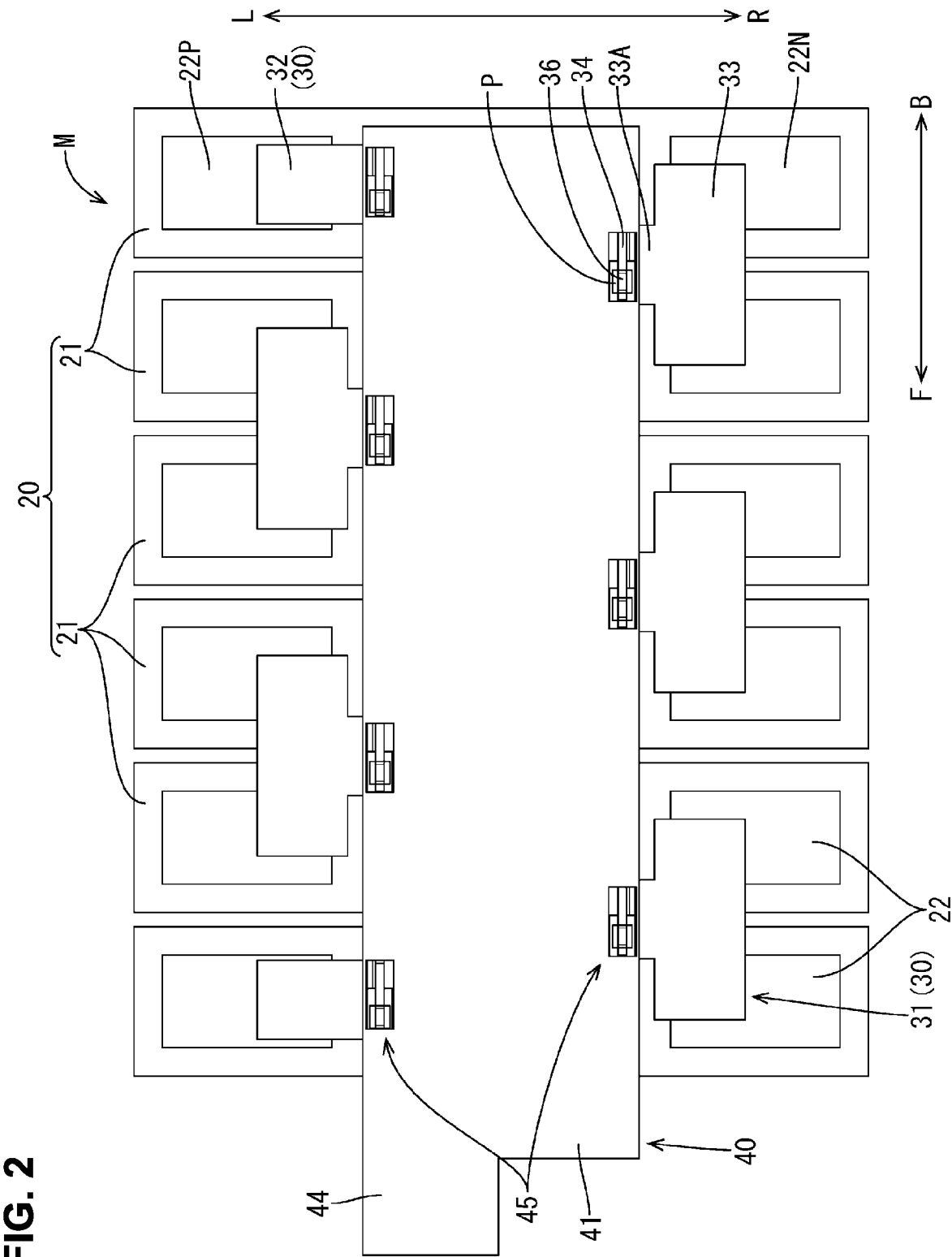
FIG. 2 is a plan view of the power storage module.
Figure 3:
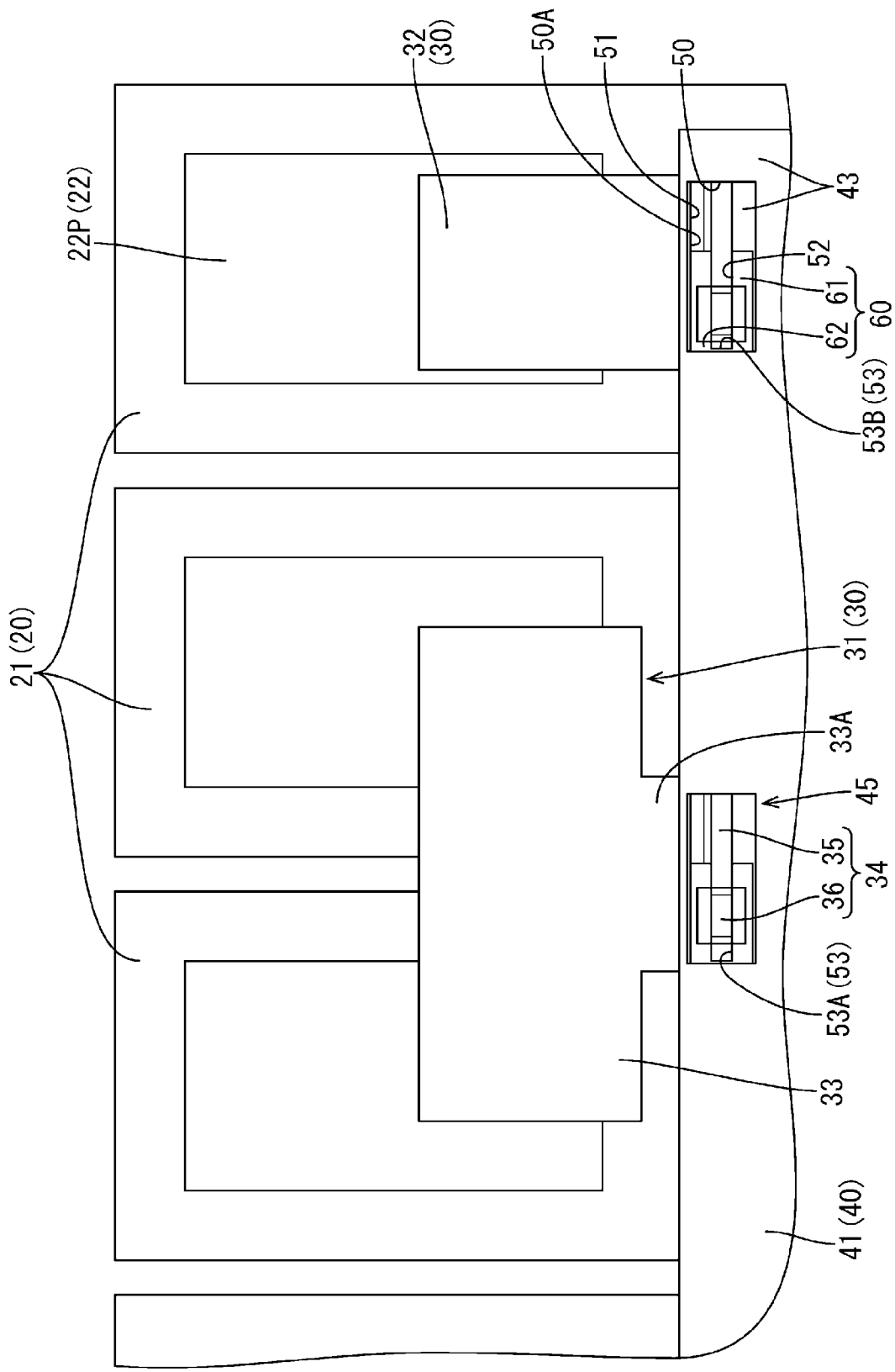
FIG. 3 is a partially enlarged plan view showing a state in which protruding portions of conductive members are connected to lands of a flexible printed circuit.
Figure 4:
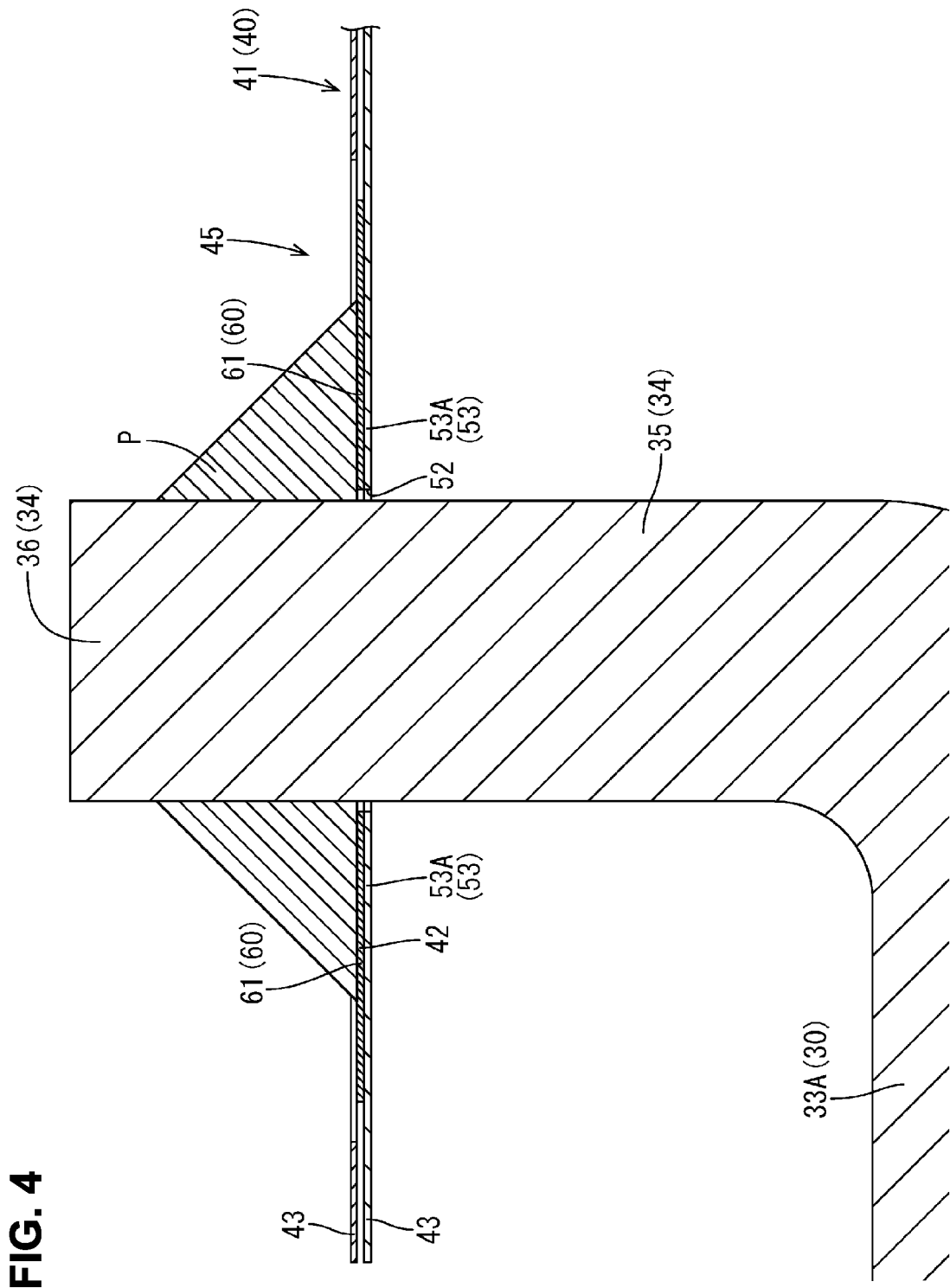
FIG. 4 is a cross-sectional view taken along line A-A in FIG. 3.

The power storage element 21 is a secondary battery having a flattened rectangular parallelepiped external shape, for example, and, as shown in FIGS. 1 and 2, the power storage element group 20 is constituted by a plurality of (six in this embodiment) power storage elements 21 lined up in a single row so as to overlap in the front-rear direction.

The power storage element 21 includes an electrode arrangement surface 23 (top surface in FIG. 1) that is orthogonal to the surface opposed to the adjacent power storage element 21, and two flat electrode terminals 22 are arranged at two end portions in the left-right direction of the electrode arrangement surface 23. One of the two electrode terminals 22 is a positive electrode terminal 22P, and the other is a negative electrode terminal 22N. In the power storage element group 20, two adjacent power storage elements 21 are lined up in a single row in the front-rear direction such that the polarities of the adjacent electrode terminals 22 are different (the positive electrode terminal 22P of one power storage element 21 and the negative electrode terminal 22N of the other power storage element 21 adjacent thereto are adjacent to each other).

The conductive member 30 is formed by processing a conductive metal plate made of copper, a copper alloy, aluminum, an aluminum alloy, stainless steel (SUS), or the like through pressing or the like, for example.

As shown in FIGS. 1 and 2, some of the conductive members 30 are connection bus bars 31 that each connect a positive electrode terminal 22P and a negative electrode terminal 22N of adjacent power storage elements 21 in the power storage element group 20, and the others are end bus bars 32 that are connected to the electrode terminals 22 arranged at the end portions of the power storage element group 20.

Figure 8:
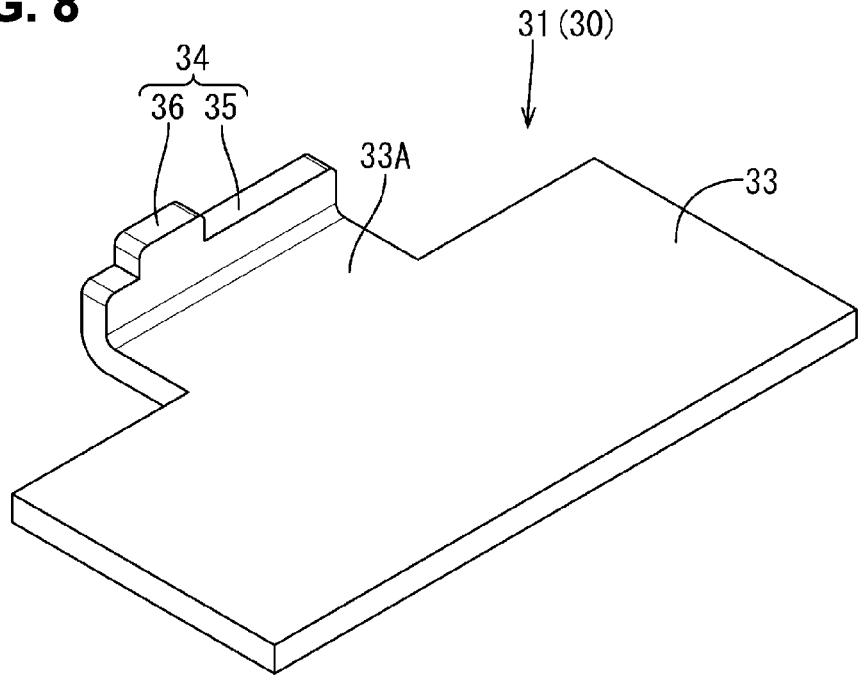
FIG. 8 is a perspective view of the conductive member.
Figure 9:
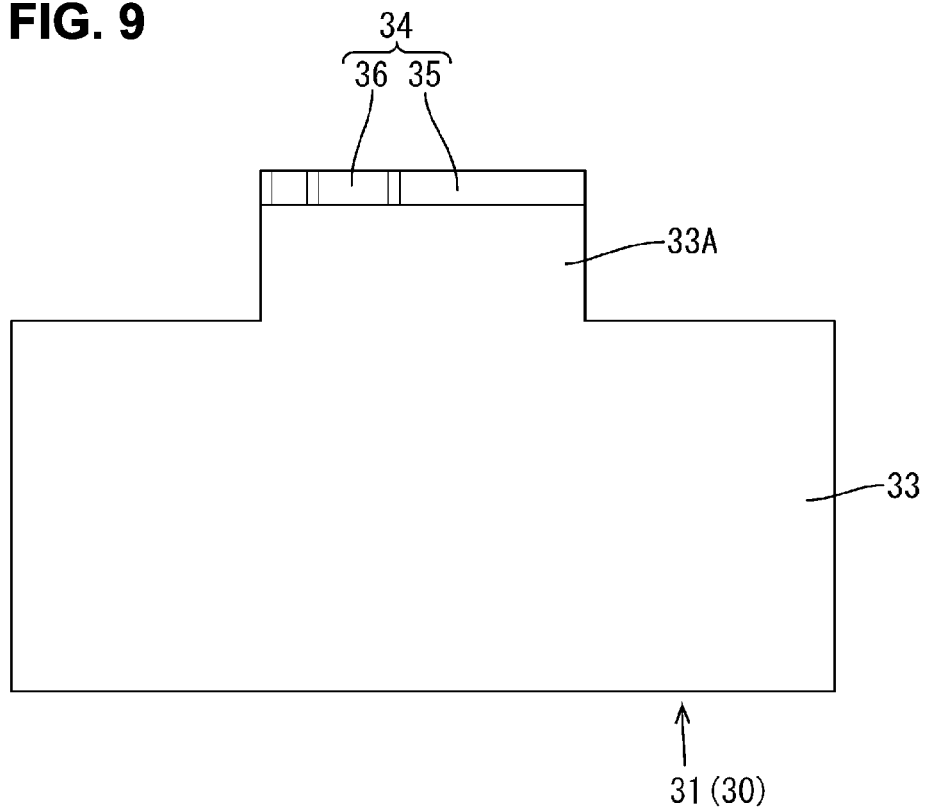
FIG. 9 is a plan view of the conductive member.

As shown in FIGS. 8 and 9, the connection bus bar 31 includes a main body portion 33 having a substantially rectangular plate shape elongated in the front-rear direction, and a connection protruding piece 34 that is continuous with one side edge in the left-right direction of the main body portion 33. It should be noted that the length in the front-rear direction of the main body portion 33 of the end bus bar 32 is smaller than that of the connection bus bar 31, but the other configurations of the end bus bar 32 are the same as those of the connection bus bar 31, and therefore, the description of the end bus bar 32 is omitted.

The main body portion 33 is electrically connected to the electrode terminal 22 of the power storage element 21 through welding or the like, and thus connects the adjacent power storage elements 21 in series as shown in FIGS. 1 and 2. Accordingly, in this embodiment, the electrode terminals 22 having different polarities of the adjacent power storage elements 21 are connected to each other via the connection bus bar 31, and thus the plurality of power storage elements 21 are connected in series and form the power storage element group 20. It should be noted that the power storage element group may also be configured as a power storage element group in which some pairs of the adjacent power storage elements included in the power storage element group are connected to each other in parallel by arranging some of the power storage elements included in the power storage element group such that the polarities of the adjacent electrode terminals are the same.

Figure 5:
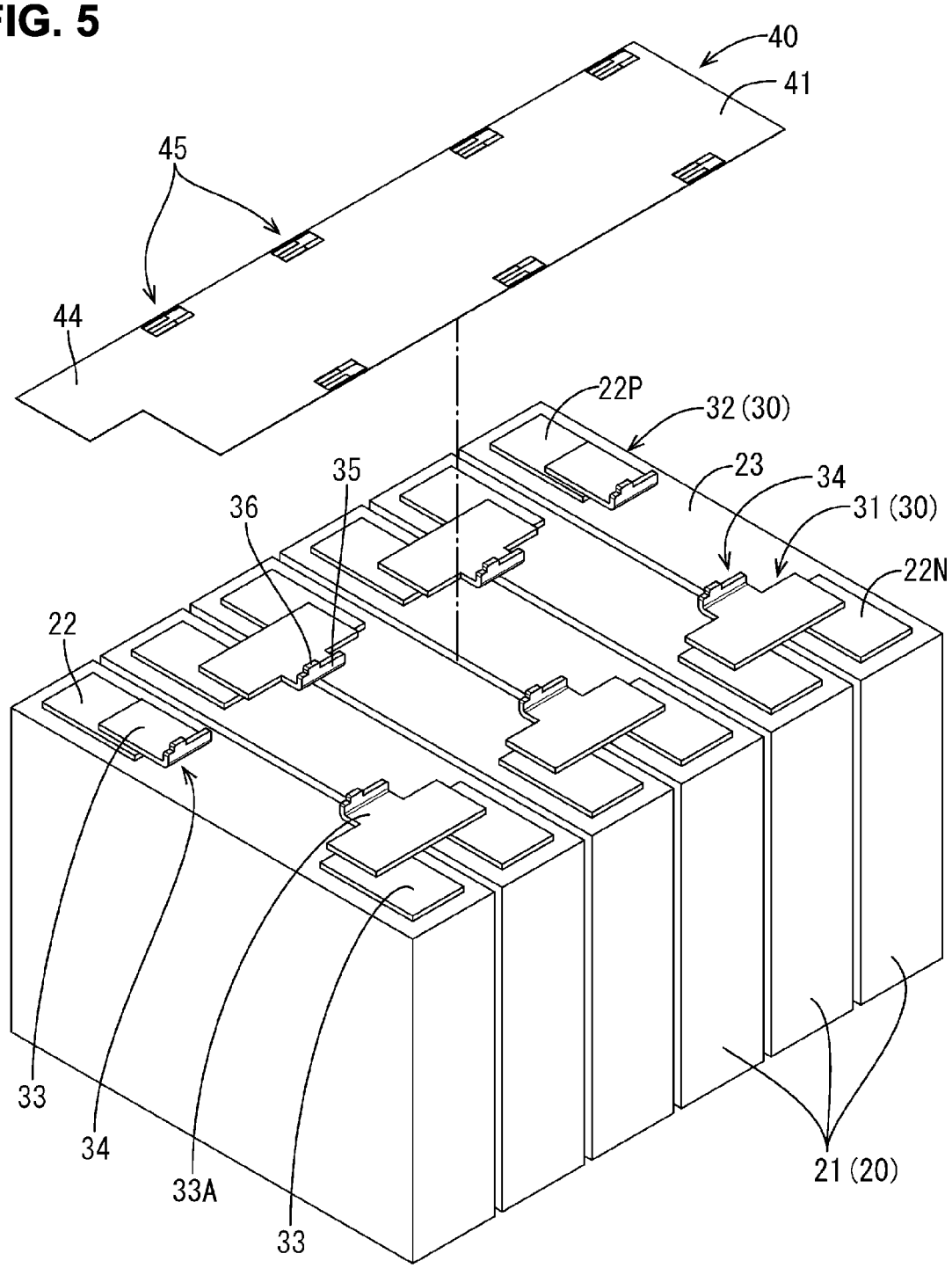
FIG. 5 is a perspective view showing a state before the flexible printed circuit is attached to the conductive members.

As shown in FIG. 5, the main body portions 33 of the conductive members 30 are arranged on the electrode terminals 22 such that the connection protruding pieces 34, which will be described later, are located at the side edges close to the centers of the power storage elements 21 and are linearly lined up in the front-rear direction in which the power storage elements 21 are lined up.

The main body portion 33 includes an extension portion 33A that extends toward the lateral side from the substantially central portion in the front-rear direction of one side edge in the left-right direction, and the connection protruding piece 34 protrudes from the extending edge of the extension portion 33A.

As shown in FIGS. 5, 8, and 9, the connection protruding piece 34 includes a flat plate portion 35 having a rectangular flat plate shape that slightly protrudes in a direction orthogonal to the plate surface of the main body portion 33, and a connection protruding portion 36 (an example of the "protruding portion") that further protrudes from the extending end of the flat plate portion 35 in the orthogonal direction.

The connection protruding portion 36 is formed in a rectangular parallelepiped shape that is shorter than the flat plate portion 35 in the front-rear direction.

Figure 6:
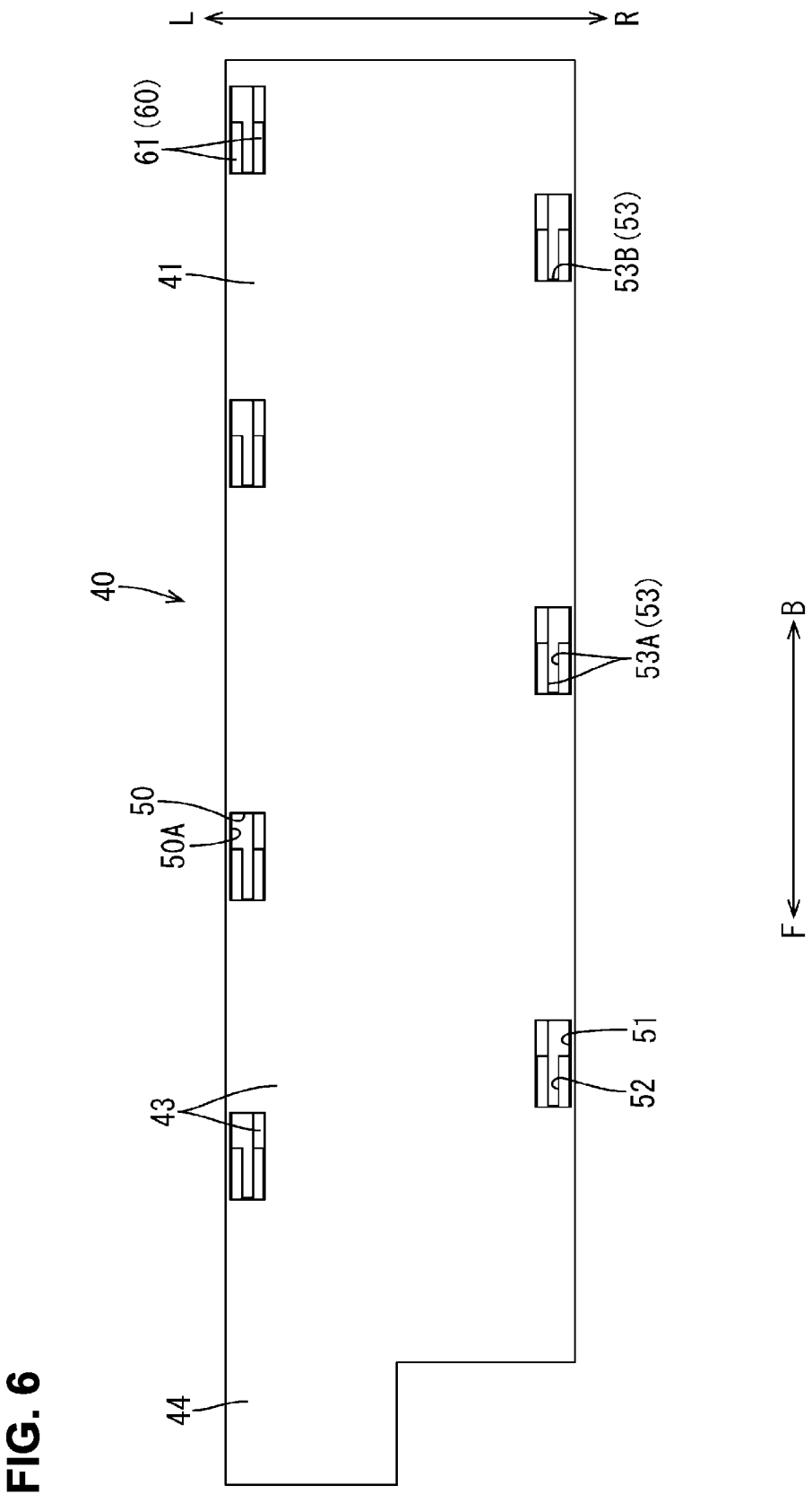
FIG. 6 is a plan view of the flexible printed circuit.

The FPC 40 is a member for electrically connecting the plurality of conductive members 30 to an electronic control unit (also referred to as an "ECU" hereinafter) and transmitting, to the ECU, voltages applied to the conductive members 30. As shown in FIGS. 1, 2, and 6, the FPC 40 includes a sheet-like FPC main body 41 having a substantially rectangular shape elongated in the front-rear direction that extends in the direction in which the power storage elements 21 are lined up.

Figure 12:
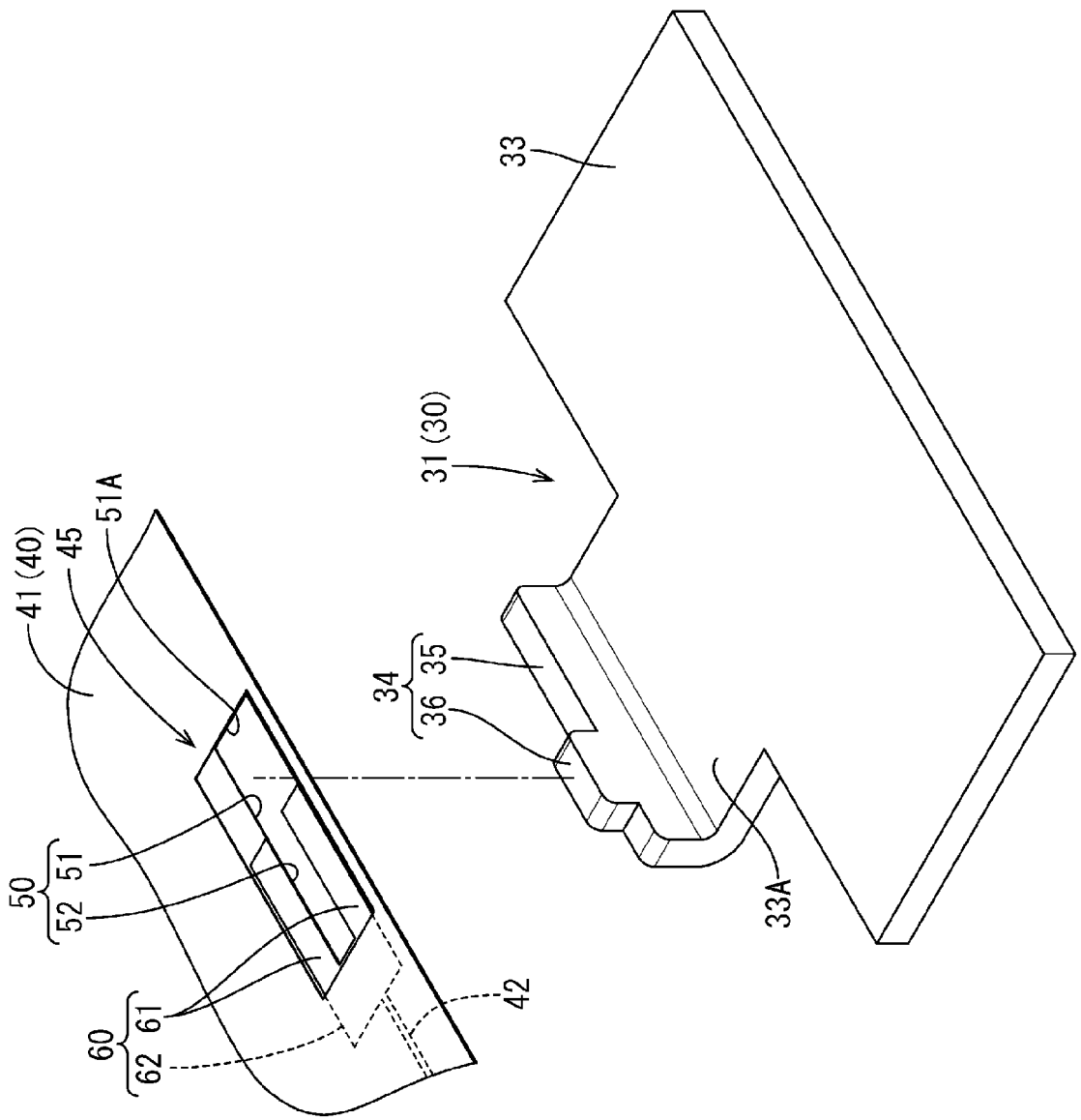
FIG. 12 is a perspective view showing a state before the protruding portion of the conductive member is inserted into the inlet opening.

As shown in FIG. 12, the FPC main body 41 includes a plurality of conductive paths 42 formed using a copper foil, and insulating resin films 43 covering the two surfaces of each conductive path 42.

As shown in FIG. 6, an external connection portion 44 having a substantially rectangular shape that protrudes forward is provided at the front-end portion of the FPC main body 41. The front-end portions, which are end portions on one side, of the plurality of conductive paths 42 are collected in the external connection portion 44, and the conductive paths 42 are connected to the ECU via this external connection portion 44.

The FPC main body 41 is provided with a plurality of joining portions 45 to which the conductive members 30 are to be connected are linearly lined up in the extension direction of the FPC main body 41, at the two side-edge portions in the left-right direction.

Figure 7:
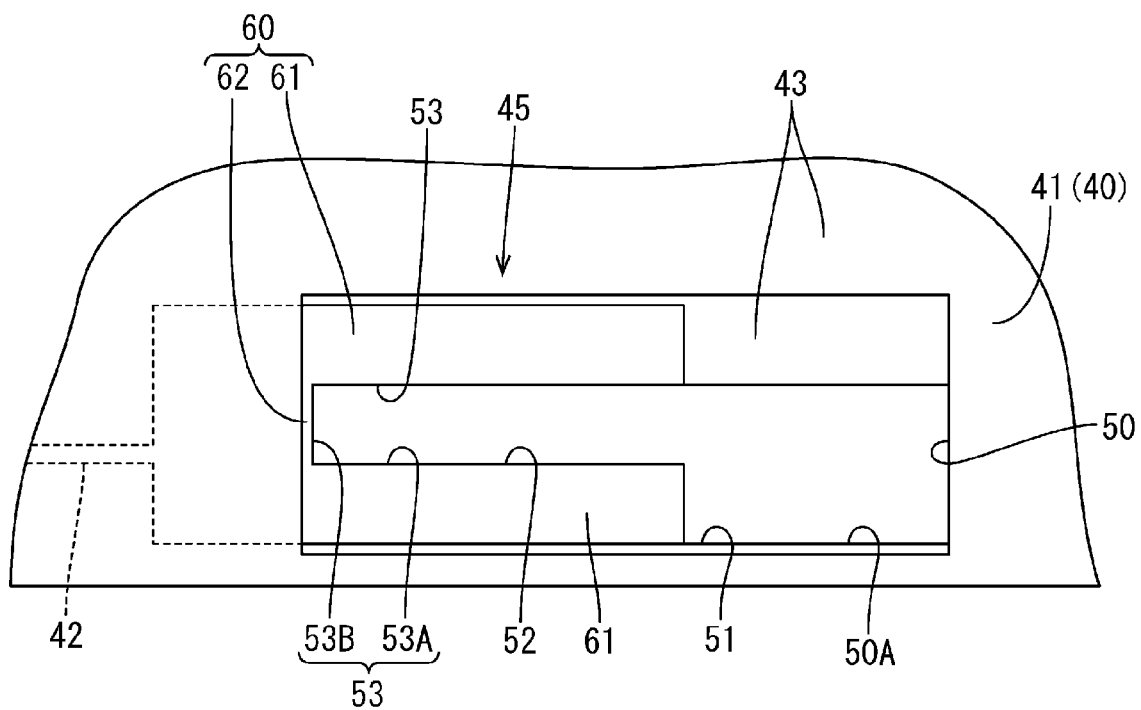
FIG. 7 is an enlarged plan view of a relevant portion in FIG. 6.

As shown in FIGS. 6, 7, and 12, each of the joining portions 45 has a substantially rectangular shape elongated in the front-rear direction, and is constituted by an insertion opening 50 that penetrates the FPC main body 41 in the thickness direction, and a land 60 formed by exposing the rear end portion, which is an end portion on the other side, of one of the conductive paths 42 to the upper side, which is a side opposite to the power storage element 21.

The insertion opening 50 is an opening whose opening edge 50A is continuous, and the connection protruding portion 36 of the conductive member 30 can be inserted into the insertion opening 50 from the lower side, which is the power storage element 21 side.

The insertion opening 50 is constituted by an inlet opening 51 that is arranged at the rear end portion of the joining portion 45, and an entrance opening 52 that is continuous with the front portion of the inlet opening 51.

Figure 10:
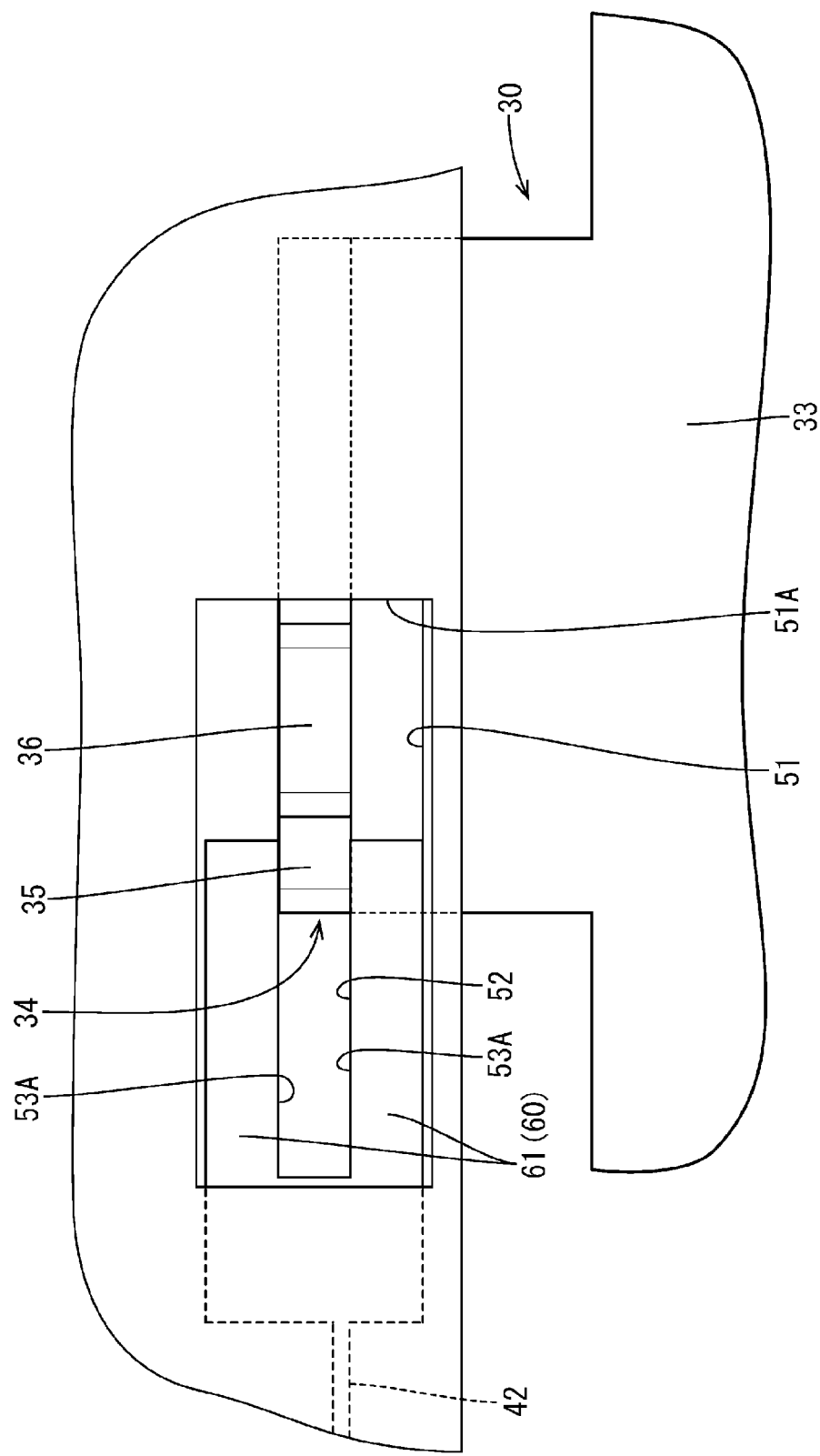
FIG. 10 is a plan view showing a state in which the protruding portion of the conductive member is inserted into an inlet opening.

The inlet opening 51 is formed in a substantially rectangular shape that is larger in size than the external shape of the connection protruding portion 36 of the conductive member 30 in a plan view, and the connection protruding portion 36 is inserted into the inlet opening 51 with a gap being formed between the connection protruding portion 36 and an edge portion 51A of the inlet opening 51 (i.e., around the connection protruding portion 36) as shown in FIG. 10.

Figure 11:
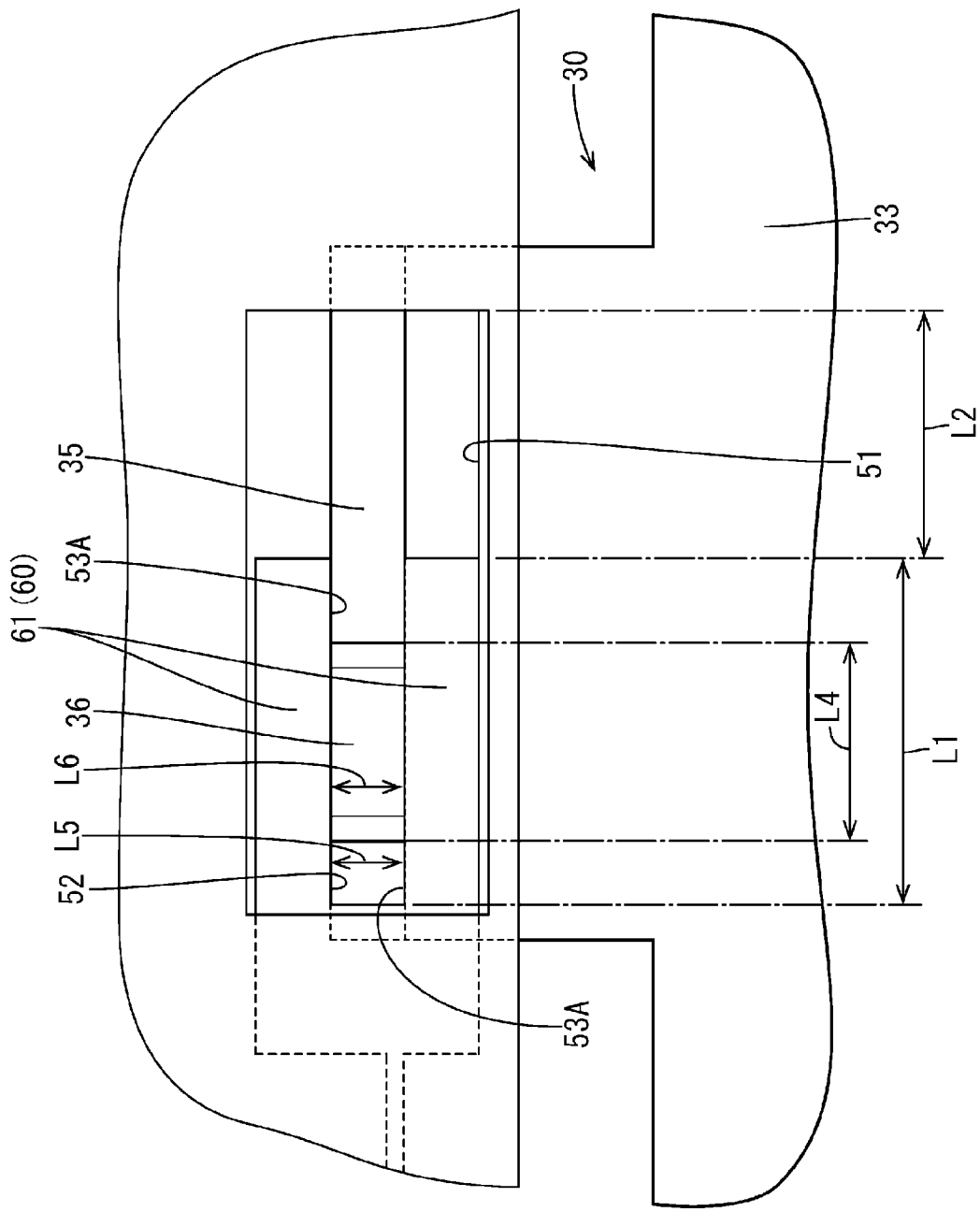
FIG. 11 is a plan view showing a state in which the protruding portion is moved into an entrance opening.

As shown in FIG. 11, the entrance opening 52 has a shape elongated in the front-rear direction, which is the direction in which the conductive members 30 are lined up. The entrance opening 52 extends forward from a position close to the center of the FPC main body 41 at the front end of the inlet opening 51.

A length L1 in the front-rear direction of the entrance opening 52 is set to be larger than a length L2 in the front-rear direction of the inlet opening 51, and is larger than the sum of a maximum tolerance L3 of the dimension of the gap in the front-rear direction between the connection protruding portions 36 of the conductive members 30 that are adjacent to each other in the front-rear direction and are connected to the power storage element group 20 (the sum of the maximum value of the manufacturing tolerances of the connection portions 36 and the maximum value of the attachment tolerances thereof), and a length L4 in the front-rear direction of the connection protruding portion 36 (i.e., L1≥L3+L4).

An opening width L5 in the left-right direction (orthogonal direction), which is orthogonal to the extension direction of the entrance opening 52, is substantially the same as a length L6 in the left-right direction of the connection protruding portion 36 of the conductive member 30, and the connection protruding portion 36 of the conductive member 30 inserted into the inlet opening 51 can be moved into the entrance opening 52 in a tightly fitted state.

Figure 13:
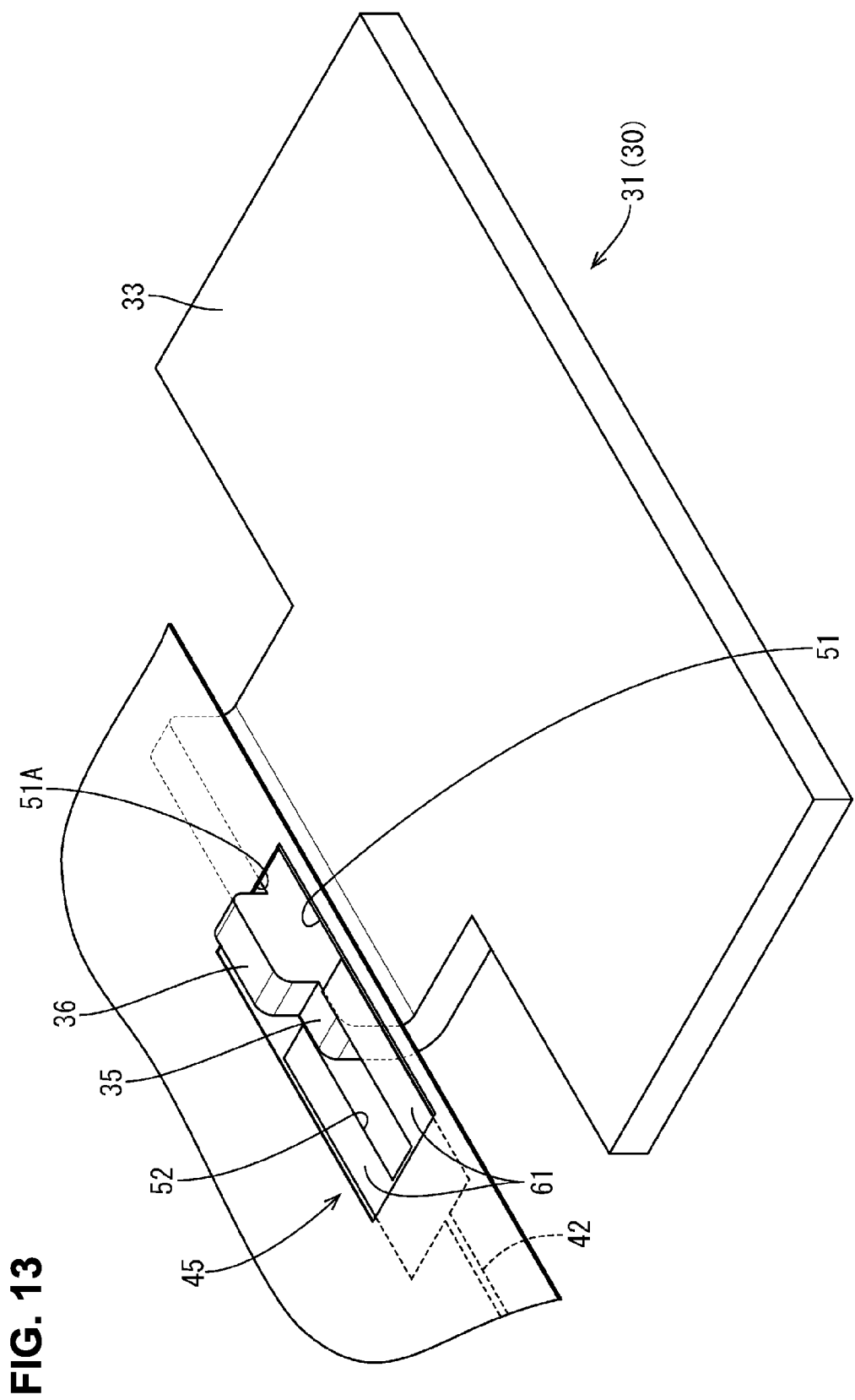
FIG. 13 is a perspective view showing a state in which the protruding portion of the conductive member is inserted into the inlet opening.

Accordingly, as shown in FIGS. 10 and 13, the connection protruding portion 36 can be easily inserted into the insertion opening 50 by inserting the connection protruding portion 36 into the inlet opening 51, and the connection protruding portion 36 is moved into the entrance opening 52 in a tightly fitted state by sliding the FPC 40 rearward in the state in which the connection protruding portion 36 is inserted into the inlet opening 51.

Figure 14:
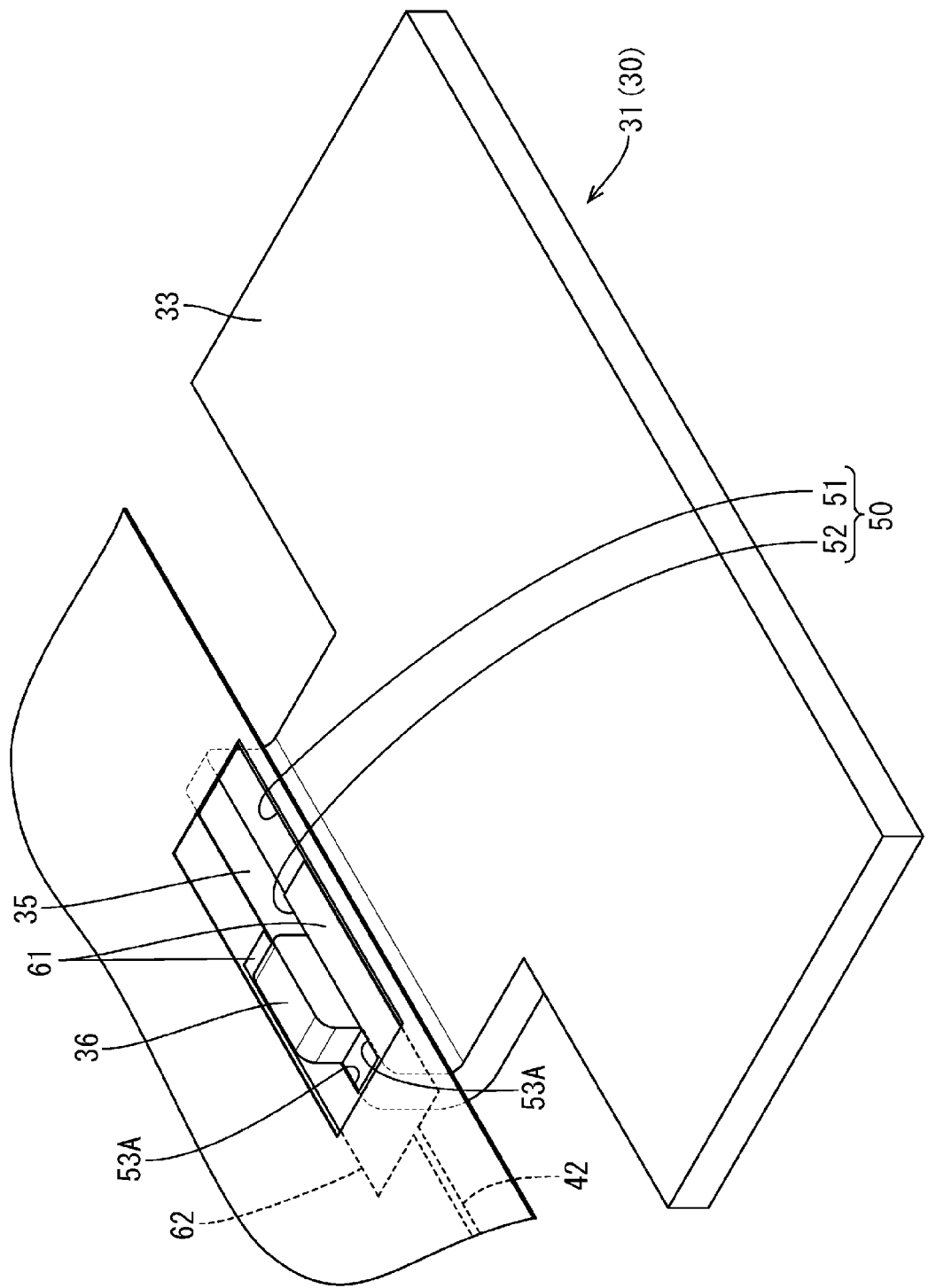
FIG. 14 is a perspective view showing a state in which the protruding portion of the conductive member is moved into the entrance opening.

That is, as shown in FIGS. 11 and 14, when the connection protruding portion 36 is moved into the entrance opening 52 of the joining portion 45, the connection protruding portion 36 and side-edge portions 53A on the two sides in the left-right direction of the entrance opening 52 are locked to each other in the left-right direction, thus making it possible to prevent two side-edge lands 61 from being misaligned in the left-right direction relative to the connection protruding portion 36.

Since all the entrance openings 52 extend forward from the front ends of the inlet openings 51 in the joining portions 45 of the FPC main body 41, the connection protruding portions 36 can be simultaneously moved into all the entrance openings 52 by sliding the FPC 40 rearward in the state in which the connection protruding portions 36 are inserted into the inlet openings 51.

As shown in FIGS. 6, 7, and 12, the land 60 is provided to an edge portion 53 of the entrance opening 52, and includes two side-edge lands 61 arranged at the side-edge portions 53A on the two sides in the left-right direction of the entrance opening 52, and a coupling land 62 arranged at a front edge portion 53B of the entrance opening 52.

The two side-edge lands 61 extend along the side-edge portions 53A of the entrance opening 52 in the front-rear direction, which is the extension direction of the entrance opening 52, over the entire lengths in the front-rear direction of the side-edge portions 53A.

The coupling land 62 couples the two side-edge lands 61 in the left-right direction along the front edge of the entrance opening 52, and the conductive path 42 extends forward from the front end of the coupling land 62.

That is, as shown in FIGS. 11 and 14, the length L1 in the front-rear direction of the entrance opening 52 is larger than the sum of the maximum tolerance L3 of the dimension between the connection protruding portions 36 of the adjacent conductive members 30 and the length L4 in the front-rear direction of the connection protruding portion 36, and therefore, when the connection protruding portion 36 is moved into the entrance opening 52 of the joining portion 45 by sliding the FPC 40 rearward, the connection protruding portion 36 is arranged without fail between the two side-edge lands 61 without protruding from the entrance opening 52. This makes it possible to easily and reliably connect the two side-edge lands 61 to the connection protruding portion 36 via solder P or the like.

This embodiment is configured as described above. The following describes a method for manufacturing the power storage module M, and the functions and the effects of the flexible printed circuit 40.

First, as shown in FIG. 5, a plurality of conductive member 30 are arranged such that the polarities of the electrode terminals 22 coupled to each other in the adjacent power storage elements 21 of the power storage element group 20 are different.

Here, the conductive members 30 are arranged such that the connection protruding pieces 34 of the conductive members 30 are located near the centers of the power storage elements 21. Also, the conductive members 30 are arranged such that the main body portions 33 of the conductive members 30 are linearly lined up in the front-rear direction, which is the direction in which the power storage elements 21 are lined up.

Next, the conductive members 30 arranged on the electrode terminals 22 are electrically connected to the electrode terminals 22 through welding or the like, and thus the power storage element group 20 in which the adjacent power storage elements 21 are connected in series is formed.

Next, the joining portions 45 of the FPC 40 are aligned with the conductive members 30, and the connection protruding portions 36 of the conductive members 30 are connected to the lands 60 of the joining portions 45 via the solder P.

Here, if the plate-like connection portions provided on the conductive members are arranged on the lands formed by exposing the conductive paths on the FPC and are soldered thereto, the plate-like connection portions may be misaligned relative to the lands, and therefore, an additional positioning means such as a positioning jig is needed.

In addition, even if the plate-like connection portions are precisely arranged on the lands, a positional misalignment of the FPC or the wiring member may occur when the lands are connected to the plate-like connection portions. If a countermeasure is taken against a positional misalignment by connecting the lands to the plate-like connection portions after positioning them individually, the operations will become complicated.

However, as shown in FIG. 11, the FPC 40 of this embodiment includes a plurality of inlet openings 51 that are larger in size than the external shapes of the connection protruding portions 36 and into which the connection portions 36 can be inserted with a gap being formed around each connection protruding portion 36, and a plurality of entrance openings 52 that are provided corresponding to the inlet openings 51 such that the connection protruding portions 36 can be moved thereinto from the inlet openings 51, are narrower than the inlet openings 51, and extend in the plate-face direction of the flexible printed circuit 40. Each of the conductive paths 42 includes the land 60 that is provided at the edge portion 53 of the entrance opening 52 and to which the connection protruding portion 36 is to be connected.

Accordingly, with this embodiment, as shown in FIGS. 10, 11, 13, and 14, the connection protruding portions 36 are moved into the entrance openings 52 in a tightly fitted state by inserting the connection protruding portions 36 of the plurality of conductive members 30 attached to the power storage element group 20 into the inlet openings 51 of the joining portions 45 of the FPC 40 and then sliding the flexible printed circuit 40 rearward. As a result, the two side-edge portions 53A of each entrance opening 52 and the connection protruding portion 36 are locked to each other in the left-right direction, and therefore, the connection protruding portion 36 of the conductive member 30 is prevented from being misaligned in the left-right direction relative to the entrance opening 52, thus making it easy to position the connection protruding portion 36 relative to the two side-edge lands 61.

In addition, since each of the connection protruding portions 36 of the conductive members 30 is inserted into the inlet opening 51 that is larger in size than the external shape of the connection protruding portion 36, and then the connection protruding portion 36 is moved into the entrance opening 52, which is narrower than the inlet opening 51, in a tightly fitted state, it is possible to inhibit the connection protruding portion 36 from dislodging from between the two side-edge lands 61 even after the connection protruding portion 36 is arranged between the two side-edge lands 61, compared with the case where a plate-like connection portion is arranged on a land, for example.

Accordingly, the connection protruding portion 36 is reliably connected to the two side-edge lands 61 via soler P, and thus the power storage module can be completed.

As described above, this embodiment is the flexible printed circuit 40 with a plurality of conductive paths 42 to which the connection protruding portions 36 of the connection protruding pieces 34 protruding from the conductive members 30 to be connected to the electrode terminals 22 of the power storage elements 21 are to be connected, and the flexible printed circuit 40 includes: a plurality of inlet openings 51 that are larger in size than the external shapes of the connection protruding portions 36 and into which the connection protruding portions 36 can be inserted with a gap being formed around each connection protruding portion 36; and a plurality of entrance openings 52 that are provided corresponding to the inlet openings 51 such that the connection protruding portions 36 can be moved thereinto from the inlet openings 51, are narrower than the inlet openings 51, and extend in the plate-face direction of the flexible printed circuit 40, wherein each of the conductive paths 42 includes the land 60 that is provided at the edge portion 53 of the entrance opening 52 and to which the connection protruding portion 36 is to be connected.

Also, this embodiment includes: a plurality of conductive members 30 that each include a main body portion 33 to be connected to the electrode terminal 22 of the power storage element 21; and the flexible printed circuit 40 including a plurality of conductive paths 42 to which the conductive members 30 can be connected, wherein each of the conductive member 30 includes the connection protruding piece 34 protruding from the main body portion 33, the flexible printed circuit 40 includes: a plurality of inlet openings 51 that are larger in size than the external shapes of the connection protruding portions 36 of the connection protruding pieces 34 and into which the connection portions 36 can be inserted with a gap being formed around each connection protruding portion 36; and a plurality of entrance openings 52 that are provided corresponding to the inlet openings 51 such that the connection protruding portions 36 can be moved thereinto from the inlet openings 51, are narrower than the inlet openings 51, and extend in the plate-face direction of the flexible printed circuit 40, and each of the conductive paths 42 includes the land 60 that is provided at the edge portion 53 of the entrance opening 52 and to which the connection protruding portion 36 can be connected.

That is, with this embodiment, when each of the connection protruding portions 36 of the conductive members 30 is inserted into the inlet opening 51, and then the connection portion 36 is moved into the entrance opening 52 by sliding the flexible printed circuit 40 rearward, the side-edge portions 53A in the left-right direction, which is orthogonal to the direction in which the entrance opening 52 extend, and the connection protruding portion 36 are locked to each other in the left-right direction, thus making it possible to easily position of the connection protruding portion 36 of the conductive member 30 relative to the land 60 in the flexible printed circuit 40. Accordingly, the lands 60 can be easily connected to the connection protruding portions 36 via the solder P or the like.

In addition, since each of the connection protruding portions 36 of the conductive members 30 is inserted into the inlet opening 51 that is larger in size than the external shape of the connection protruding portion 36, and then the connection protruding portion 36 is moved into the entrance opening 52, which is narrower than the inlet opening 51, it is possible to inhibit the land 60 and the connection protruding portion 36 from being misaligned relative to each other even after the land 60 and the connection protruding portion 36 are positioned, compared with the case where a plate-like connection portion is arranged on a land, for example.

The plurality of entrance openings 52 extend forward from the inlet openings 51 in the same manner, and thereby all of the extension directions of the entrance openings 52 are the same. Accordingly, the connection protruding portions 36 can be simultaneously moved into the entrance openings 52 and positioned by inserting the connection protruding portions 36 into the plurality of inlet openings 51 and then sliding the entire flexible printed circuit 40 rearward.

The two side-edge lands 61 of the land 60 extend in the front-rear direction, which is the extension direction in which the entrance opening 52 extends, and therefore, even if some of the connection protruding portions 36 to be inserted into the plurality of inlet openings 51 are slightly misaligned in the front-rear direction, the connection protruding portions 36 can be connected to the lands 60.

That is, it is possible to further inhibit the lands 60 from not being capable of being connected to the connection protruding portions 36 due to positional misalignments of the lands 60 relative to the connection protruding portions 36.

The length L1 in the front-rear direction of each land 60 is set to be larger than the sum of the maximum tolerance L3 of the dimension between the adjacent connection protruding portions 36 and the length L4 in the front-rear direction of the connection protruding portion 36.

Specifically, the length L1 in the front-rear direction of each land 60 is set to be larger than the sum of the maximum tolerance L3 of the dimension between the connection protruding portions 36 of the plurality of conductive members 30 and the length L4 in the front-rear direction of the connection protruding portion 36.

That is, with such a configuration, the length L1 in the front-rear direction of the land 60 is larger than the sum of the maximum tolerance L3 of the dimensions of the connection protruding portions 36 of the plurality of conductive members 30 in the direction in which the connection protruding portions 36 are lined up and the length L4 in the front-rear direction of the connection protruding portion 36, and therefore, even when the sizes of the gaps in the front-rear direction, which is the direction in which the plurality of conductive members 30 are lined up, vary due to the attachment tolerance or manufacturing tolerance, for example, it is possible to inhibit the connection protruding portions 36 and the lands 60 from being misaligned relative to each other. Accordingly, the lands 60 can be reliably connected to the connection protruding portions 36.

With this embodiment, the insertion opening 50 constituted by the entrance opening 52 and the inlet opening 51 is an opening whose opening edge 50A is continuous.

For example, if insertion openings are open in the side portion of a flexible printed circuit and each opening edge is not continuous, the strength of a portion of the side portion provided with the opening decreases, and as a result, there is a concern that it will be difficult to move the protruding portion into the entrance opening from the inlet opening, and the protruding portion that has been moved into the entrance opening will dislodge from the entrance opening.

However, with this embodiment, the opening edge 50A of the insertion opening 50 is continuous, and therefore, it is possible to suppress a decrease in strength of the opening edge 50A of the insertion opening 50. Accordingly, it is possible to suppress the difficulties of moving the connection protruding portion 36 into the entrance opening 52 from the inlet opening 51, and to inhibit the protruding portion 36 that has been moved into the entrance opening 52 from dislodging from the entrance opening 52.

In this embodiment, the opening width L5 in the left-right direction of the entrance opening 52 is equal to the length L6 in the left-right direction of the connection protruding portion 36, and therefore, the connection protruding portion 36 can be easily connected to the land 60 via the solder P or the like. It should be noted that the case described herein where the opening width L5 of the entrance opening 52 is equal to the length L6 in the left-right direction of the connection protruding portion 36 encompasses a case where the opening width L5 of the entrance opening 52 is set to be slightly larger than the length L6 in the left-right direction of the connection protruding portion 36, and a case where the opening width L5 of the entrance opening 52 is set to be slightly smaller than the length L6 in the left-right direction of the connection protruding portion 36.

Embodiment 2

Next, Embodiment 2 will be described with reference to FIGS. 15 to 20.

A power storage module M1 of Embodiment 2 includes an alignment member 70 for lining up and holding the conductive members 30 of Embodiment 1, and is a variation in which the lengths L1 in the front-rear direction of the entrance openings 52 of the FPC 40 is changed. The descriptions of the functions and effects in common with Embodiment 1 are redundant and may thus be omitted. The configurations that are the same as those of Embodiment 1 are denoted by the same reference numerals.

The power storage module M1 of Embodiment 2 includes the power storage element group 20 in which a plurality of power storage elements 21 are lined up, and a wiring module WM attached to the electrode arrangement surface 23 of the power storage element group 20.

The wiring module WM includes a plurality of conductive members 30 that each include the main body portion 33 connected to the electrode terminal 22 of the power storage element 21, an FPC 140 including a plurality of conductive paths 42 to which the conductive members 30 are connected, and the alignment member 70 for lining up the plurality of conductive members 30 linearly in the front-rear direction, which is the direction in which the power storage elements 21 are lined up, and holding them.

The power storage module M1 of this embodiment is formed by integrating the plurality of conductive members 30, the FPC 140, and the alignment member 70 into one wiring module WM and then attaching the wiring module WM to the electrode arrangement surface 23 of the power storage element group 20. It should be noted that the power storage element group 20 and the conductive members 30 are configured in the same manner as in Embodiment 1, and thus the individual descriptions thereof are omitted.

Figure 18:
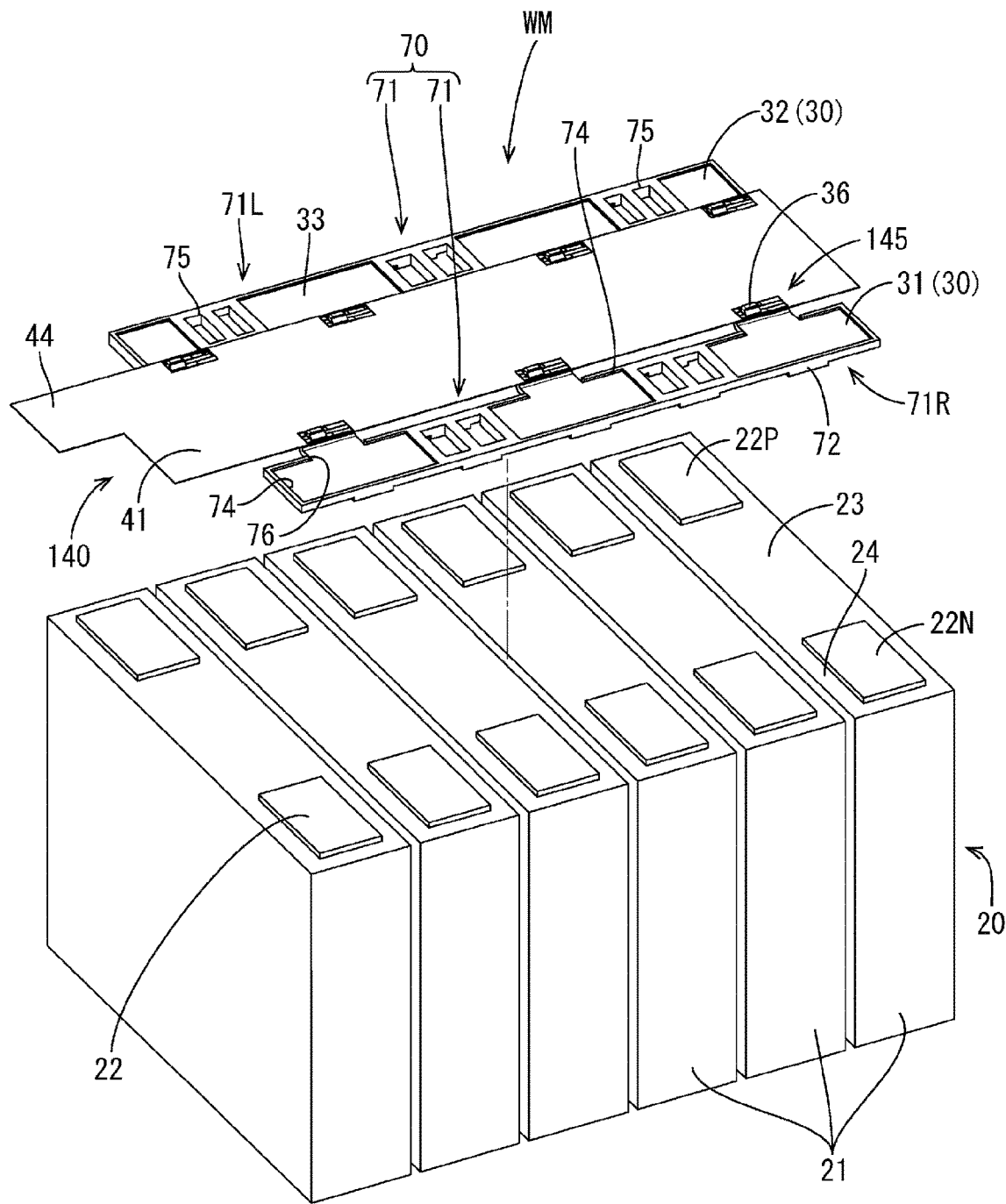
FIG. 18 is a perspective view showing a state before a wiring module is attached to a power storage element group.

The alignment member 70 is made of an insulating resin and includes two holding members 71 attached onto the electrode arrangement surface 23 of the power storage element group 20 from above as shown in FIG. 18.

Figure 19:
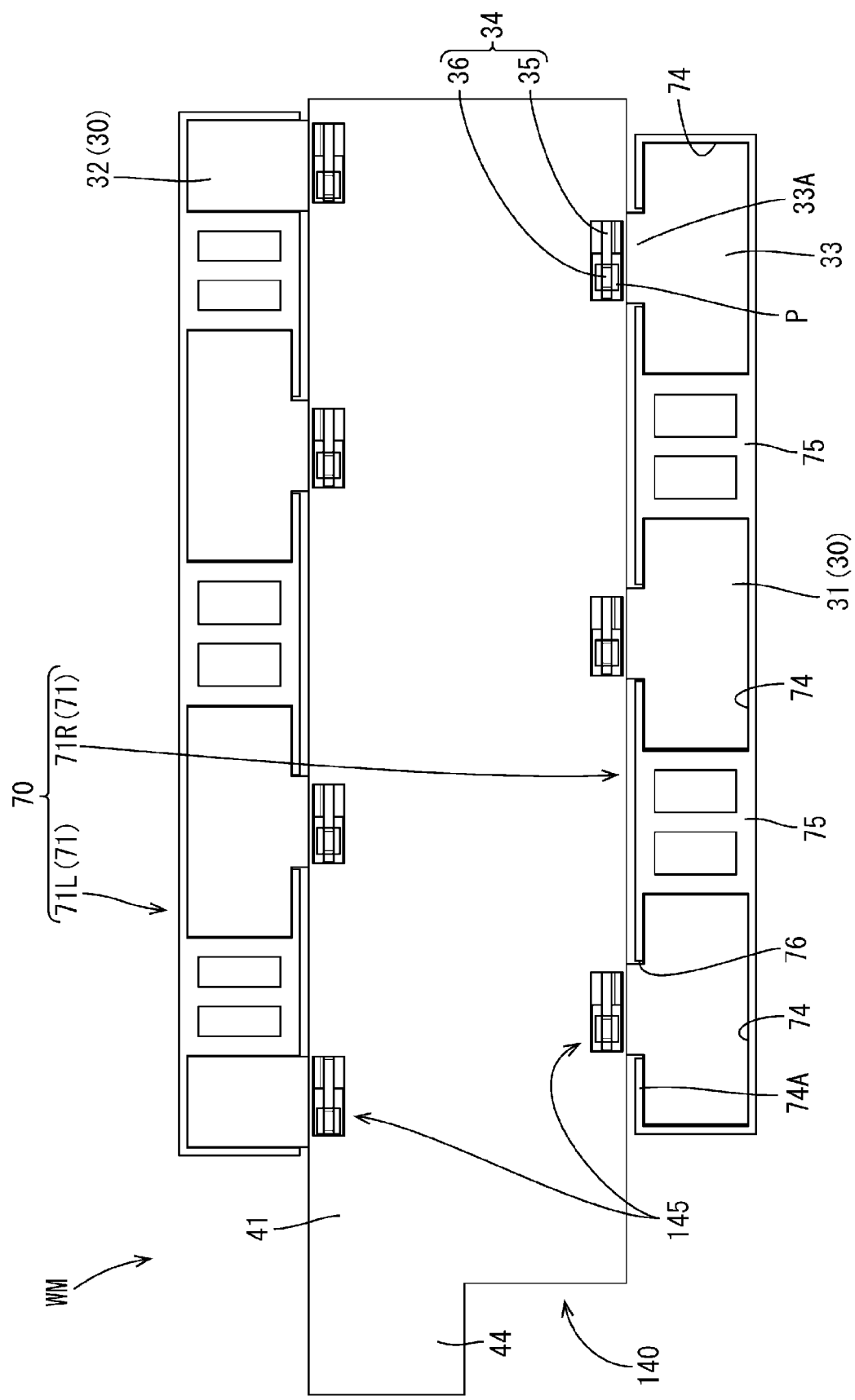
FIG. 19 is a plan view of the wiring module.
Figure 20:
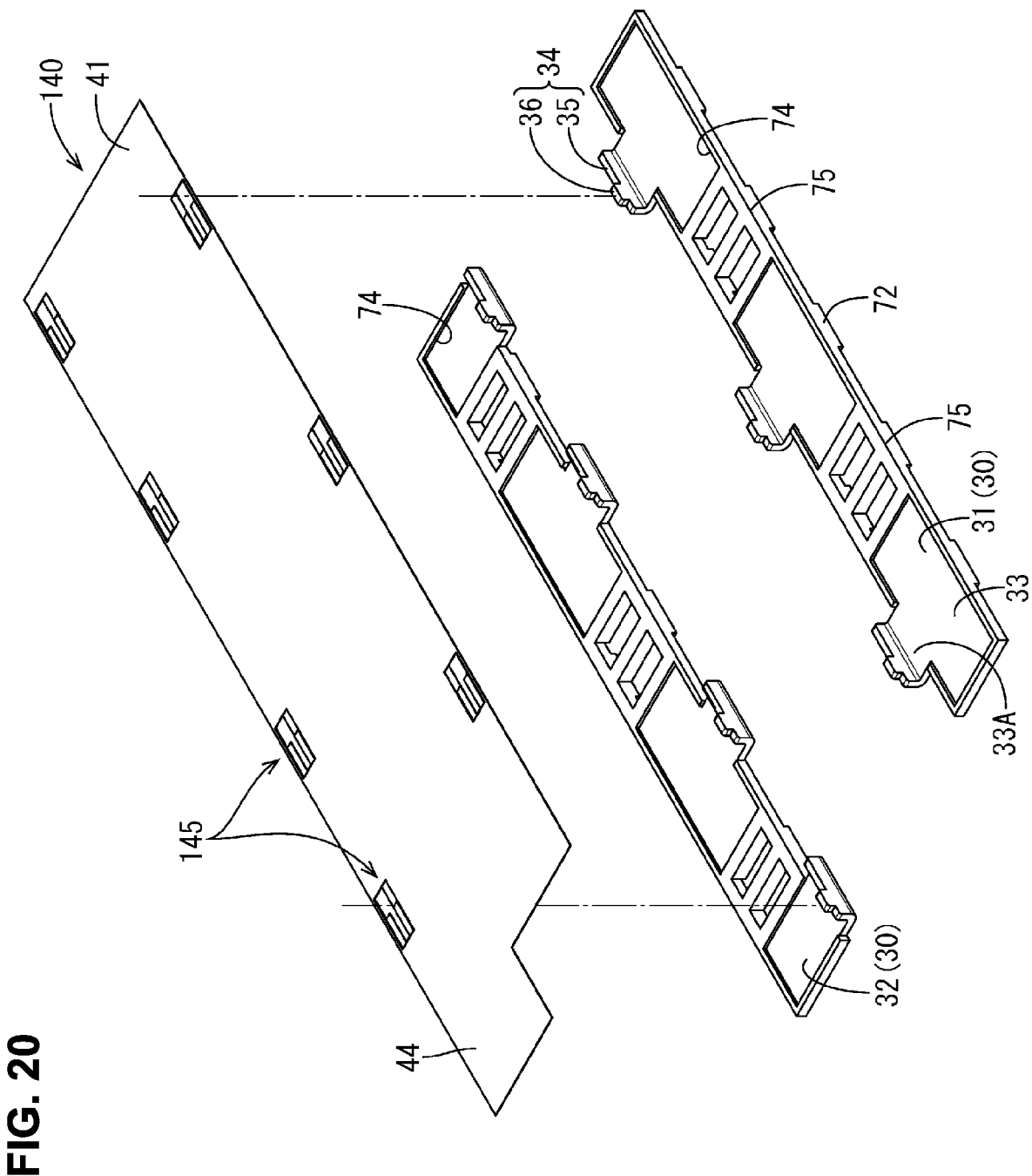
FIG. 20 is a perspective view showing a state before a flexible printed circuit is attached to conductive members.

As shown in FIGS. 18 to 20, the two holding members 71 are formed in a substantially rectangular flat-plate shape elongated in the front-rear direction, which is the direction in which the power storage elements 21 are lined up.

Regarding the two holding members 71, a holding member 71 for lining up, linearly in the front-rear direction, the conductive members 30 that connect the right-side electrode terminals 22 of the power storage elements 21 and holding them is taken as a first holding member 71R (an example of a "first alignment member"), and a holding member 71 for lining up, linearly in the front-rear direction, the conductive members 30 that connect the left-side electrode terminals 22 and holding them is taken as a second holding member 71L (an example of a "second alignment member").

Fitting protruding portions 72 that are fitted from above to fitting recessed portions 24 provided between the electrode terminals 22 of the power storage elements 21 adjacent to each other in the front-rear direction in the power storage element group 20 are provided at the lower end portions of the first holding member 71R and the second holding member 71L.

Figure 15:
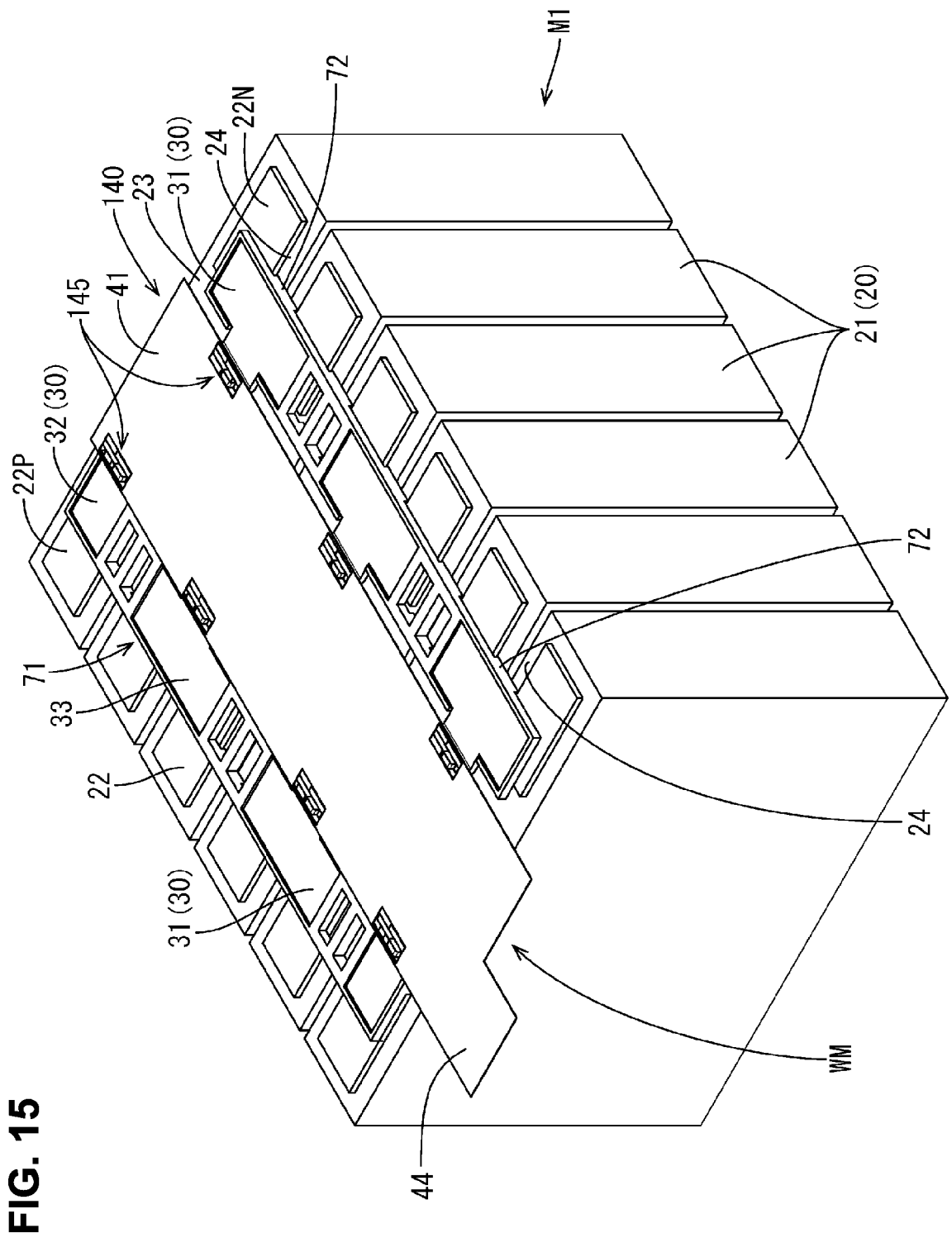
FIG. 15 is a perspective view of a power storage module according to Embodiment 2.
Figure 17:
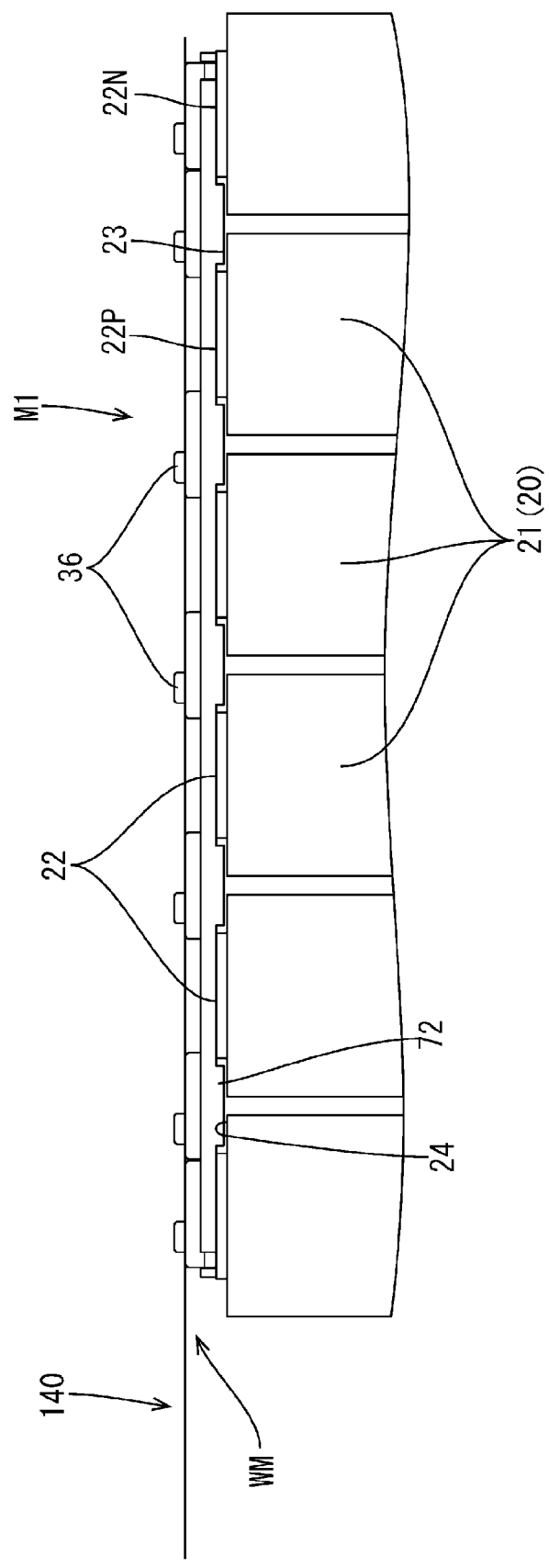
FIG. 17 is a side view of the power storage module in which a portion thereof is not shown.

As shown in FIGS. 15 and 17, the first holding member 71R is arranged on the electrode terminals 22 located on the right end portion of the power storage element group 20 such that the fitting protruding portions 72 are fitted to the fitting recessed portions 24, and the second holding member 71L is arranged on the electrode terminals 22 located on the left end portion of the power storage element group 20 such that the fitting protruding portions 72 are fitted to the fitting recessed portions 24.

As shown in FIGS. 18 to 20, a plurality of accommodation portions 74 in which the conductive members 30 are accommodated in the state of being lined up in a single row in the front-rear direction are provided in the upper portions of the first holding member 71R and the second holding member 71L with coupling portions 75 being located between the accommodation portions 74. In the first holding member 71R and the second holding member 71L of this embodiment, three accommodation portions 74 are coupled via two coupling portions 75 and lined up in a single row in the front-rear direction.

Each of the accommodation portions 74 has a substantially rectangular shape in a plan view and is open downward (i.e., toward the power storage element 21) and upward (i.e., toward a side opposite to the power storage element 21), and is provided with a central opening 76 corresponding to a portion that is open in a wall portion 74A located near the centers of the power storage elements 21. The main body portions 33 of the conductive members 30 are tightly accommodated in the accommodation portions 74 from above. When the main body portions 33 are accommodated in the accommodation portions 74, the connection protruding pieces 34 are tightly fitted to the central openings 76. Also, when the main body portions 33 are accommodated in the accommodation portions 74, the main body portions 33 are supported from below by supporting portions (not shown) provided at the lower end portions of the accommodation portions 74.

Accordingly, when the main body portions 33 of the conductive members 30 are accommodated in all the accommodation portions 74 of the first holding member 71R and the second holding member 71L, the conductive members 30 are lined up in a single line in the front-rear direction at the two end portions in the left-right direction of the power storage element group 20, and the connection protruding portions 36 of the connection protruding pieces 34 of the conductive members 30 are lined up in a single line in the front-rear direction. It should be noted that, when the main body portions 33 of the conductive members 30 are accommodated in the accommodation portions 74, locking portions (not shown) provided to the accommodation portions 74 prevent the main body portions 33 from dislodging from the accommodation portions 74.

Figure 16:
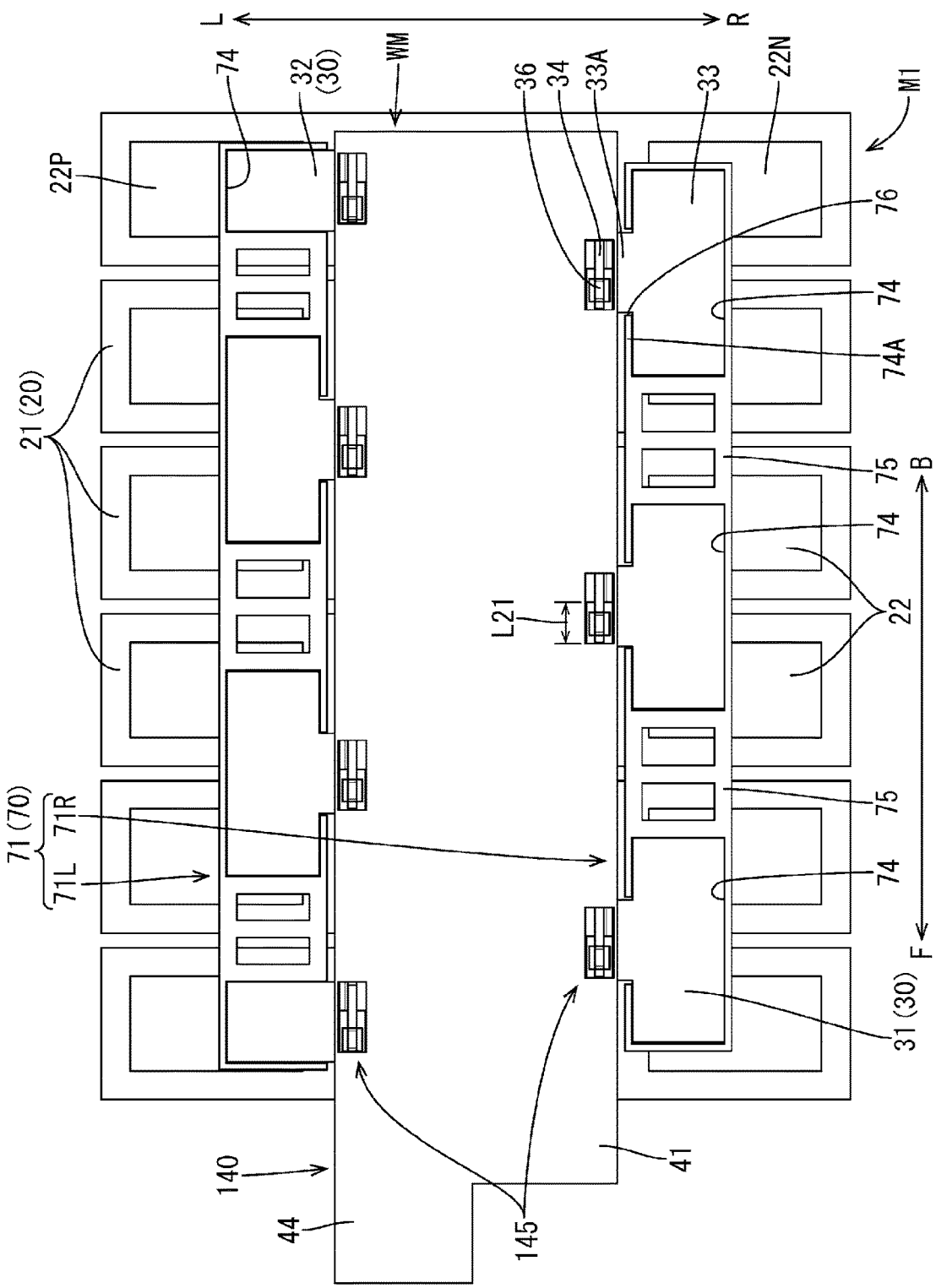
FIG. 16 is a plan view of the power storage module.

On the other hand, as shown in FIG. 16, the FPC 140 has the same configuration as described in Embodiment 1, except that a length L21 in the front-rear direction of an entrance opening 152 of a joining portion 145 is different.

The length L21 in the front-rear direction of the entrance opening 152 is set to be larger than the sum of the maximum tolerance L23 of the dimensions in the front-rear direction of the first holding member 71R and the second holding member 71L when the alignment member 70 is attached to the power storage element group 20, and the length L4 in the front-rear direction of the connection protruding portion 36 (L21≥L23+L4).

The wiring module WM of this embodiment is configured as described above. The following describes a method for manufacturing the wiring module WM and a method for manufacturing the power storage module M1.

First, the main body portions 33 of the conductive members 30 are accommodated in all the accommodation portions 74 of the first holding member 71R and the second holding member 71L of the alignment member 70 from above, and thereby the two holding members 71 in which a plurality of conductive members 30 are lined up in a single line in the front-rear direction are formed.

Next, as shown in FIG. 20, the two holding members 71 are arranged such that the distance between the first holding member 71R and the second holding member 71L is substantially equal to the distance between the two electrode terminals 22 of the power storage element 21, and the fitting protruding portions 72 of the first holding member 71R and the second holding member 71L can be fitted to the fitting recessed portions 24 of the power storage element groups 20.

Then, when the arrangement of the two holding members 71 is completed, the FPC 140 is attached to the two holding members 71 from above such that the connection protruding portions 36 of the conductive members 30 are inserted into the inlet openings 51 of the FPC 140 from below.

Next, the connection protruding portions 36 inserted into the inlet openings 51 are moved into the entrance openings 152 in a tightly fitted state by sliding the FPC 140 rearward. As a result, the two side-edge portions 53A in the left-right direction of each entrance opening 152 are locked to the connection protruding portion 36 in the left-right direction, and thus the connection protruding portion 36 of the conductive member 30 is positioned relative to the two side-edge lands 61 of the land 60 in the FPC 140 in the left-right direction.

Here, with this embodiment, the length L21 in the front-rear direction of the entrance opening 152 is set to be larger than the sum of the maximum tolerance L23 of the dimensions in the front-rear direction of the first holding member 71R and the second holding member 71L and the length L4 in the front-rear direction of the connection protruding portion 36, and therefore, even when the second holding member 71L is misaligned relative to the first holding member 71R in the front-rear direction due to the manufacturing tolerances or attachment tolerances of the first holding member 71R and the second holding member 71L, it is possible to prevent the connection protruding portion 36 from dislodging from the two side-edge lands 61 and to reliably connect the connection protruding portion 36 to the two side-edge lands 61.

Next, after each of the connection protruding portions 36 of the conductive members 30 is positioned relative to the two side-edge lands 61 in the flexible printed circuit 40, the connection protruding portion 36 is connected to the two side-edge lands 61 via the solder P. As a result, as shown in FIGS. 18 and 19, the wiring module WM is completed in which the alignment member 70, the plurality of conductive members 30 that are lined up in two lines using the alignment member 70, and the FPC 140 that is connected to the connection protruding portions 36 of the conductive member 30 are integrated.

After the wiring module WM has been completed, the wiring module WM is attached to the electrode arrangement surface 23 of the power storage element group 20 such that the fitting protruding portions 72 of the alignment member 70 are fitted to the fitting recessed portion 24 of the power storage element group 20, and then the main body portions 33 of the conductive members 30 are welded to the electrode terminals 22 of the power storage elements 21. The power storage module M1 is thus completed as shown in FIGS. 15 and 17.

As described above, this embodiment is the wiring module WM to be attached to the power storage element group 20 in which a plurality of power storage element 21 with the two electrode terminals 22 are lined up, and the wiring module WM includes: a plurality of conductive members 30 that each have the main body portion 33 to be connected to the electrode terminal 22 of the power storage element 21, and the connection protruding piece 34 protruding from the main body portion 33; the flexible printed circuit 40 including a plurality of conductive paths 42 to which the conductive members 30 are connected; and the alignment member 70 that lines up the plurality of conductive members 30 in the front-rear direction, which is the direction in which the power storage elements 21 are lined up, and holds the conductive members 30, wherein the flexible printed circuit 40 includes: a plurality of inlet openings 51 that are larger in size than the external shapes of the connection protruding portions 36 of the connection protruding pieces 34 and into which the connection portions 36 can be inserted with a gap being formed around each connection protruding portion 36; and a plurality of entrance openings 152 that are in communication with the inlet openings 51 such that the connection protruding portions 36 inserted into the inlet openings 51 can be moved thereinto, are narrower than the inlet openings 51, and extend in the plate-face direction of the flexible printed circuit 40, and each of the conductive paths 42 includes the land 60 that is provided at the edge portion 53 of the entrance opening 152 and to which the connection protruding portion 36 is connected.

The plurality of entrance openings 152 extend forward from the inlet openings 51 in the same manner, and thereby the extension directions of the entrance openings 152 are the same as the direction in which the plurality of power storage elements 21 are lined up.

The alignment member 70 includes: the first holding member (first alignment member) 71R for lining up the conductive members 30 that connect the electrode terminals 22 located on one of the two sides and holding the conductive members 30; and the second holding member (second alignment member) 71L for lining up the conductive members 30 that connect the electrode terminals 22 on the other of the two sides and holding the conductive members 30, and the two side-edge lands 61 of each land 60 extend in the front-rear direction, which is the direction in which the entrance opening 152 extends, and the length L21 in the extension direction of the two side-edge lands 61 is set to be larger than the sum of the maximum tolerance L23 of the dimensions in the front-rear direction of the first holding member (first alignment member) 71R and the second holding member (second alignment member) 71L, and the length L4 in the front-rear direction of the connection protruding portion 36.

That is, with this embodiment, even when the second holding member 71L is misaligned relative to the first holding member 71R in the front-rear direction due to the manufacturing tolerances or attachment tolerances of the first holding member 71R and the second holding member 71L, it is possible to connect each connection protruding portion 36 to the two side-edge lands 61. That is, it is possible to prevent the two side-edge lands 61 from not being capable of being connected to the connection protruding portion 36 due to positional misalignments of the two side-edge lands 61 relative to the connection protruding portion 36.

Embodiment 3

Next, Embodiment 3 will be described with reference to FIGS. 21 to 23.

In Embodiment 3, a conductive member 230 is a variation of the conductive member 30 of Embodiment 1 in which the shape of the connection protruding portion 36 of the connection protruding piece 34 is changed, and the opening width L5 in the left-right direction of an entrance opening 252 is changed. The descriptions of the functions and effects in common with Embodiment 1 are redundant and are thus omitted. The configurations that are the same as those of Embodiment 1 are denoted by the same reference numerals.

Figure 21:
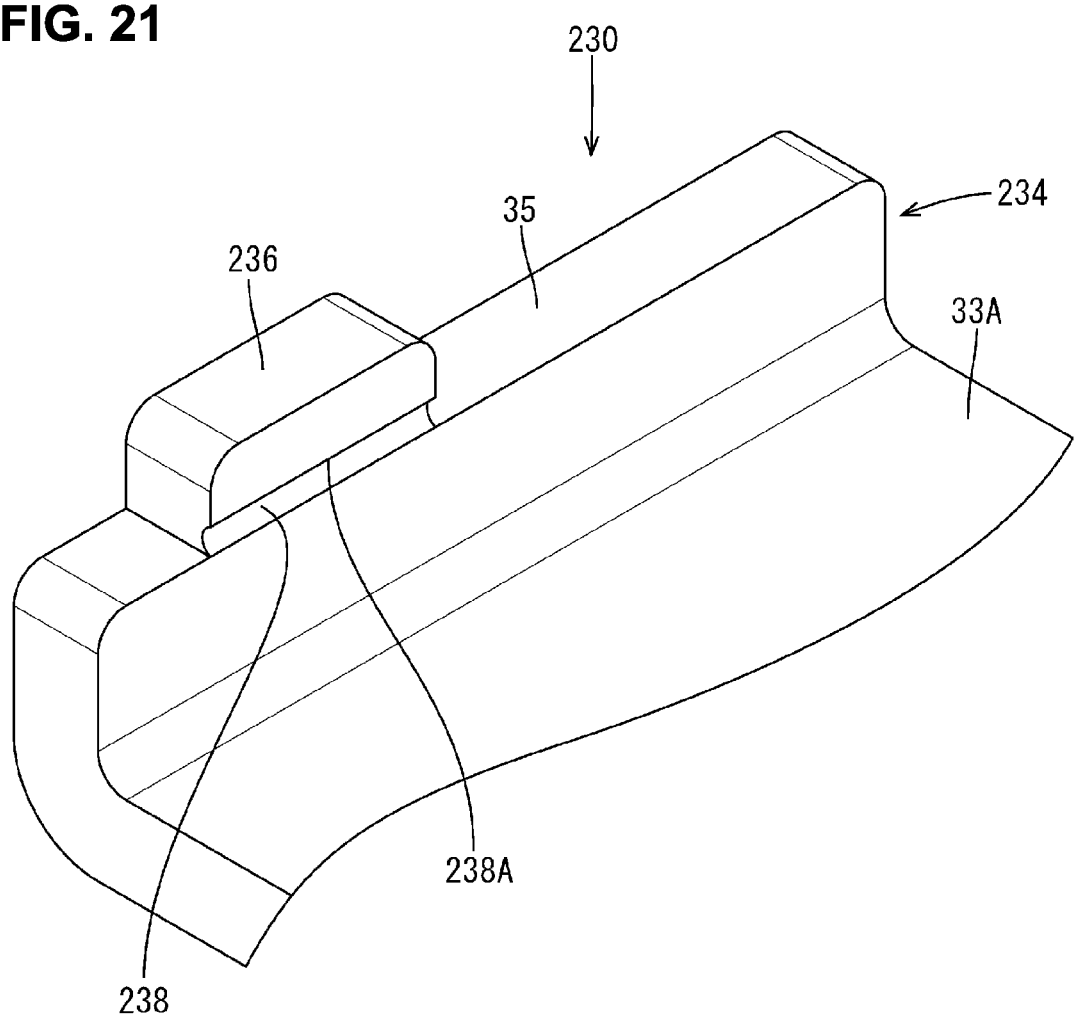
FIG. 21 is perspective view of a conductive member according to Embodiment 3 in which a portion thereof is not shown.
Figure 23:
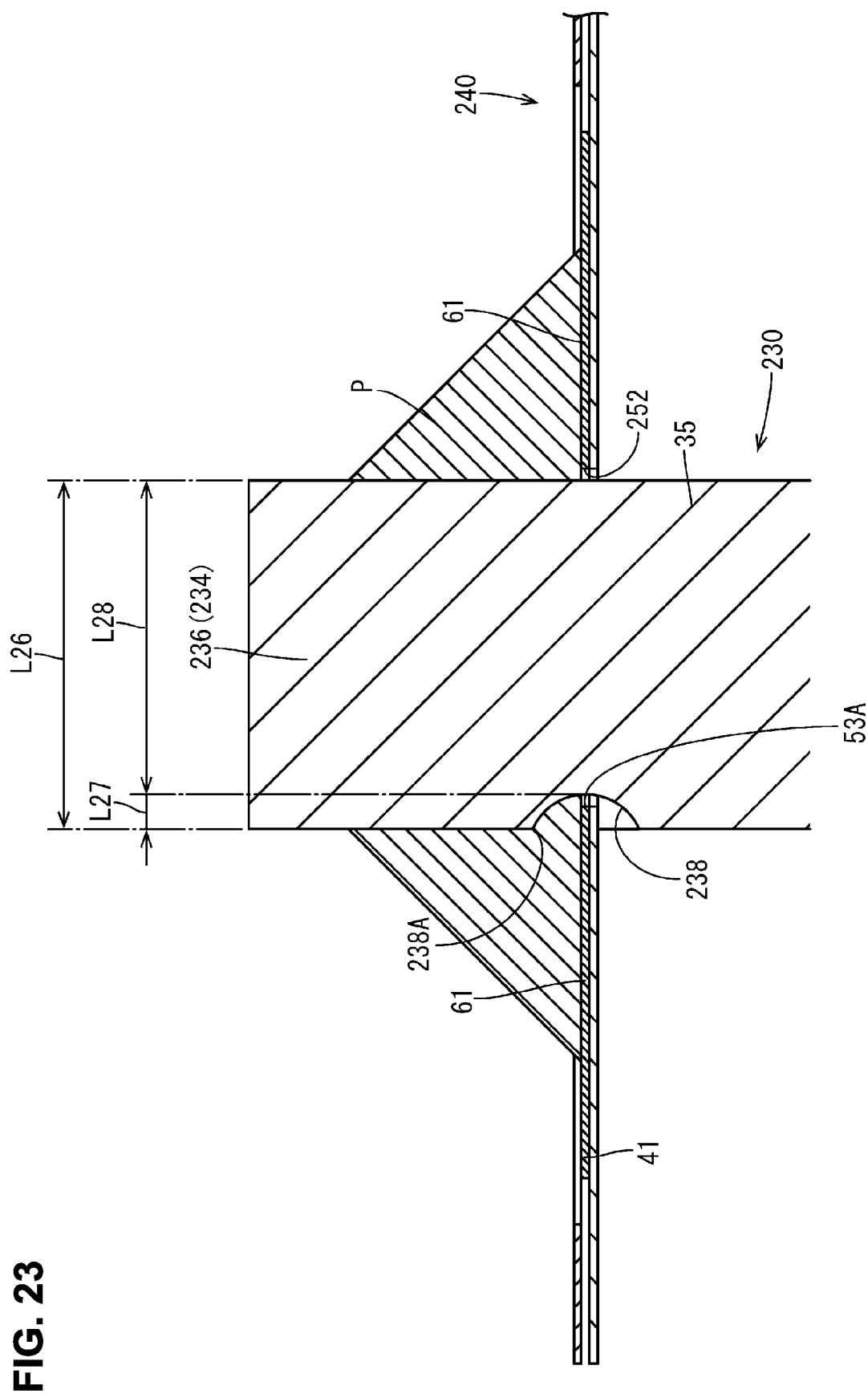
FIG. 23 is a cross-sectional view taken along line B-B in FIG. 22.

As shown in FIGS. 21 and 23, a connection protruding portion 236 of a connection protruding piece 234 of the conductive member 230 of Embodiment 3 is provided with a cutout groove 238 extending in the front-rear direction at a lower end portion on the main body portion 33 side.

The cutout groove 238 is slightly recessed in the form of an arc in the connection protruding portion 236, and extend over the entire length in the front-rear direction of the connection protruding portion 236.

Figure 22:
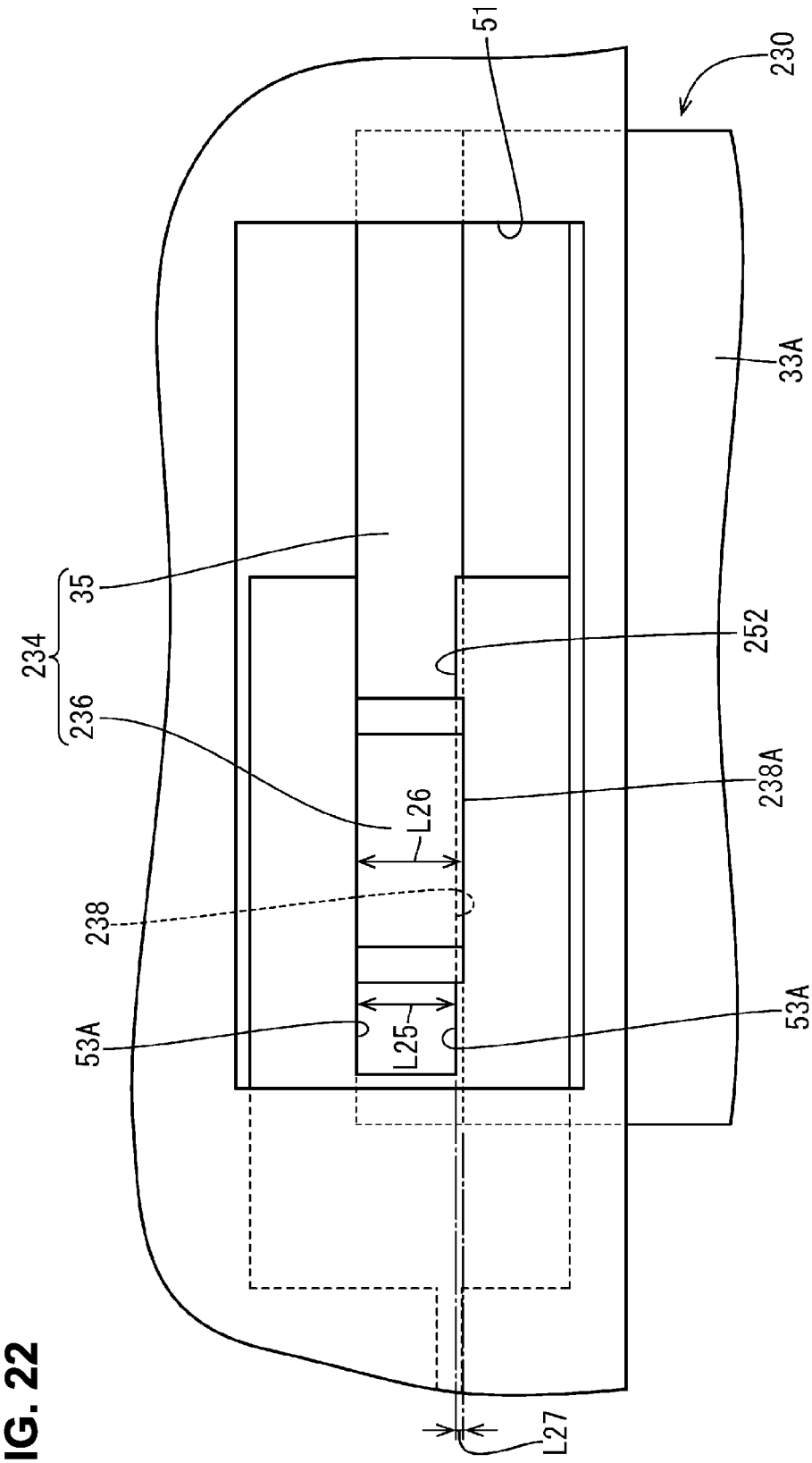
FIG. 22 is an enlarged plan view showing a state in which a protruding portion of a conductive member is connected to a land of a flexible printed circuit.

On the other hand, as shown in FIGS. 22 and 23, an opening width L25 of each entrance opening 252 in the FPC 240 is set to be smaller than a length L26 in the left-right direction of the connection protruding portion 236 and be larger than the difference L28 between the length L26 in the left-right direction of the connection protruding portion 236 and a recessed amount L27 of the cutout groove 238 (L26>L25>L28=(L26−L27)).

When the FPC 240 is slid rearward, the connection protruding portion 236 is moved into entrance opening 252 from the inlet opening 51 such that the side-edge portion 53A of the entrance opening 252 on the main body portion 33 side is fitted to the cutout groove 238 as shown in FIG. 23.

That is, when the connection protruding portion 236 is moved into the entrance opening 252, the cutout groove 238 and the side-edge portion 53A of the entrance opening 252 on the main body portion 33 side are fitted to each other through recess-projection fitting, and an engagement portion 238A, which is an upper-side edge of the cutout groove 238 and the side-edge portion 53A of the entrance opening 252 in the FPC 240 are locked to each other in the vertical direction, which is the direction in which the connection protruding portion 236 protrudes. Thereby, the connection protruding portion 236 is prevented from dislodging upward from the entrance opening 252. Accordingly, the connection protruding portion 236 of the conductive member 230 can be connected to the two side-edge lands 61 in the FPC 240 via the solder P without causing positional misalignments thereof in the vertical direction and the left-right direction.

Embodiment 4

Next, Embodiment 4 will be described with reference to FIGS. 24 to 26.

In Embodiment 4, a conductive member 330 is a variation of the conductive member 30 of Embodiment 1 in which the shape of the connection protruding portion 36 of the connection protruding piece 34 is changed. The descriptions of the functions and effects in common with Embodiment 1 are redundant and are thus omitted. The configurations that are the same as those of Embodiment 1 are denoted by the same reference numerals.

Figure 24:
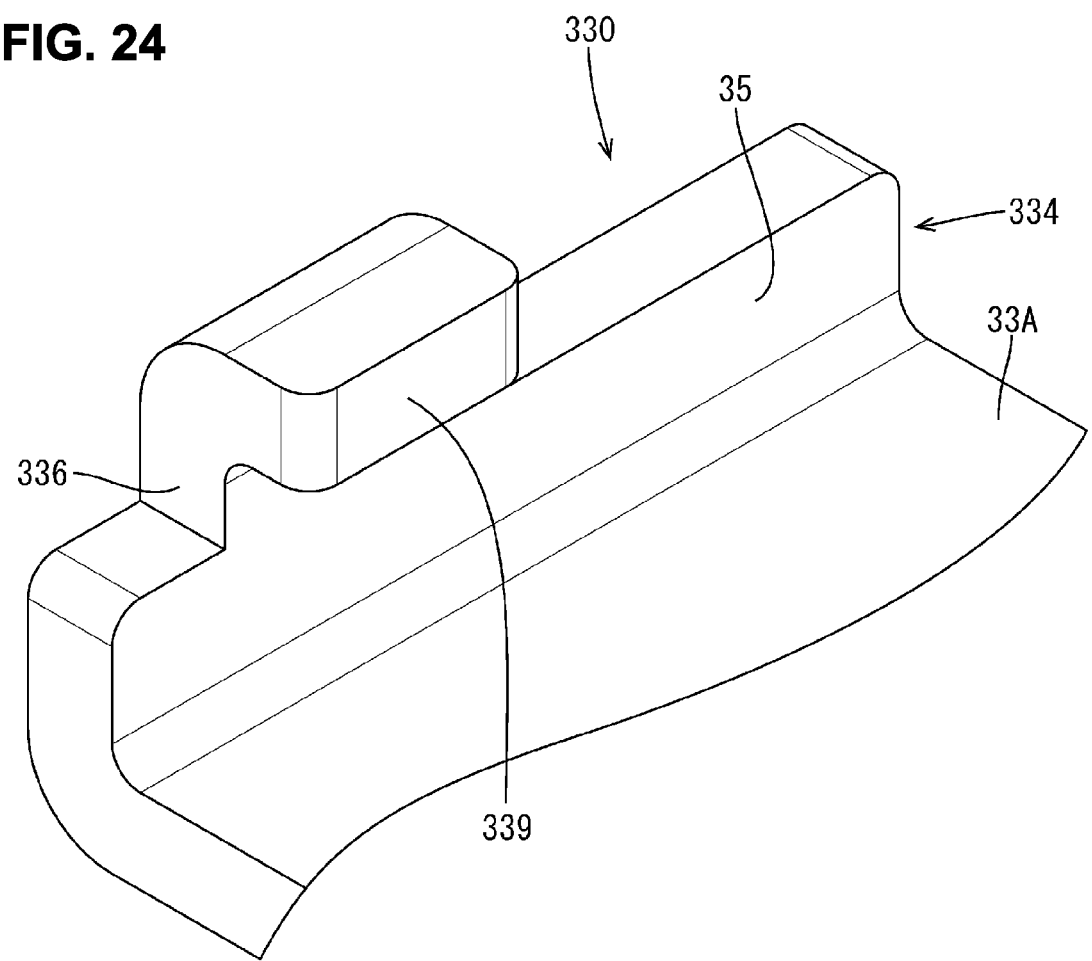
FIG. 24 is a perspective view of a conductive member according to Embodiment 4 in which a portion thereof is not shown.
Figure 25:
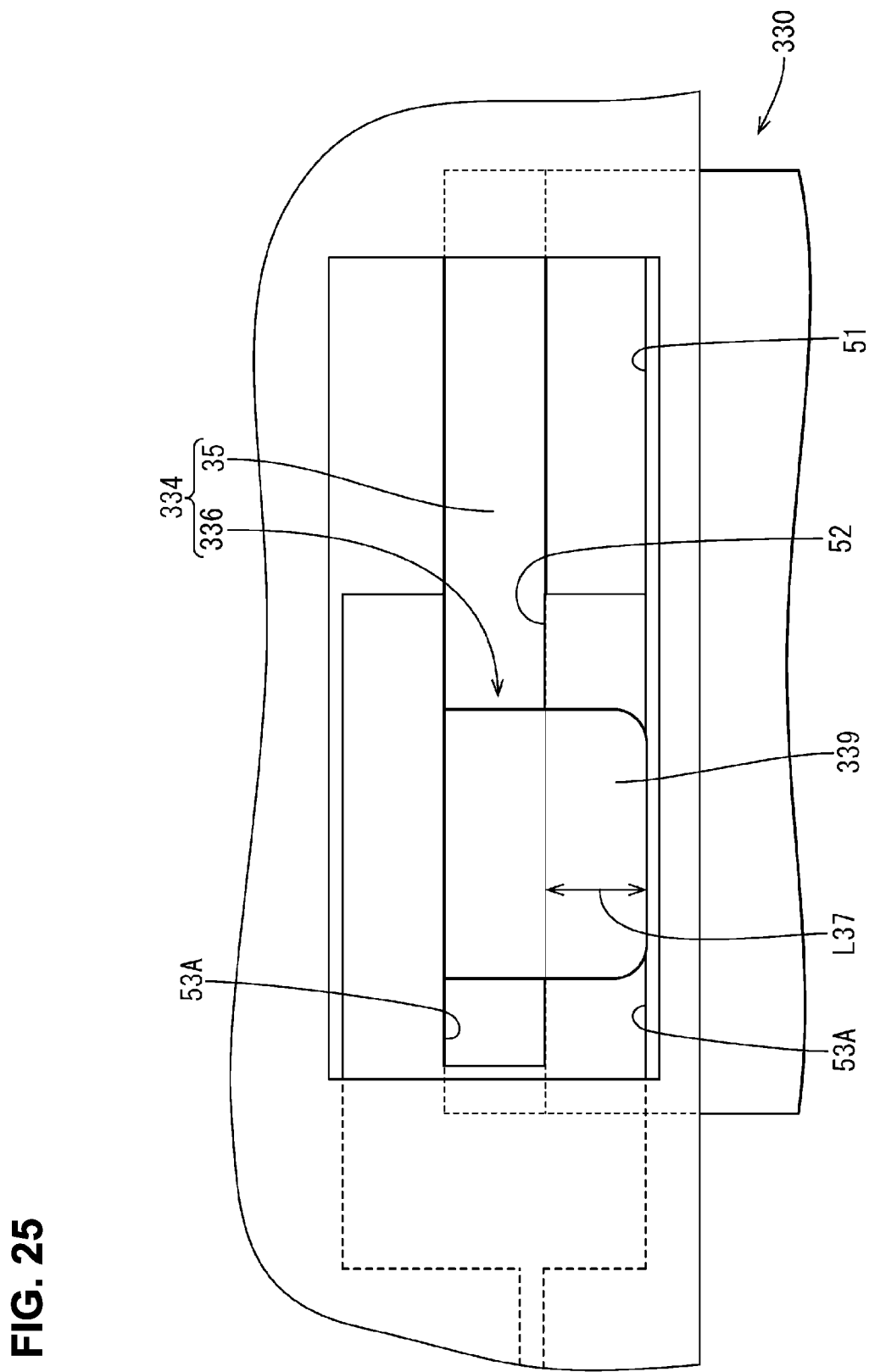
FIG. 25 is an enlarged plan view showing a state in which a protruding portion of a conductive member is connected to a land of a flexible printed circuit.
Figure 26:
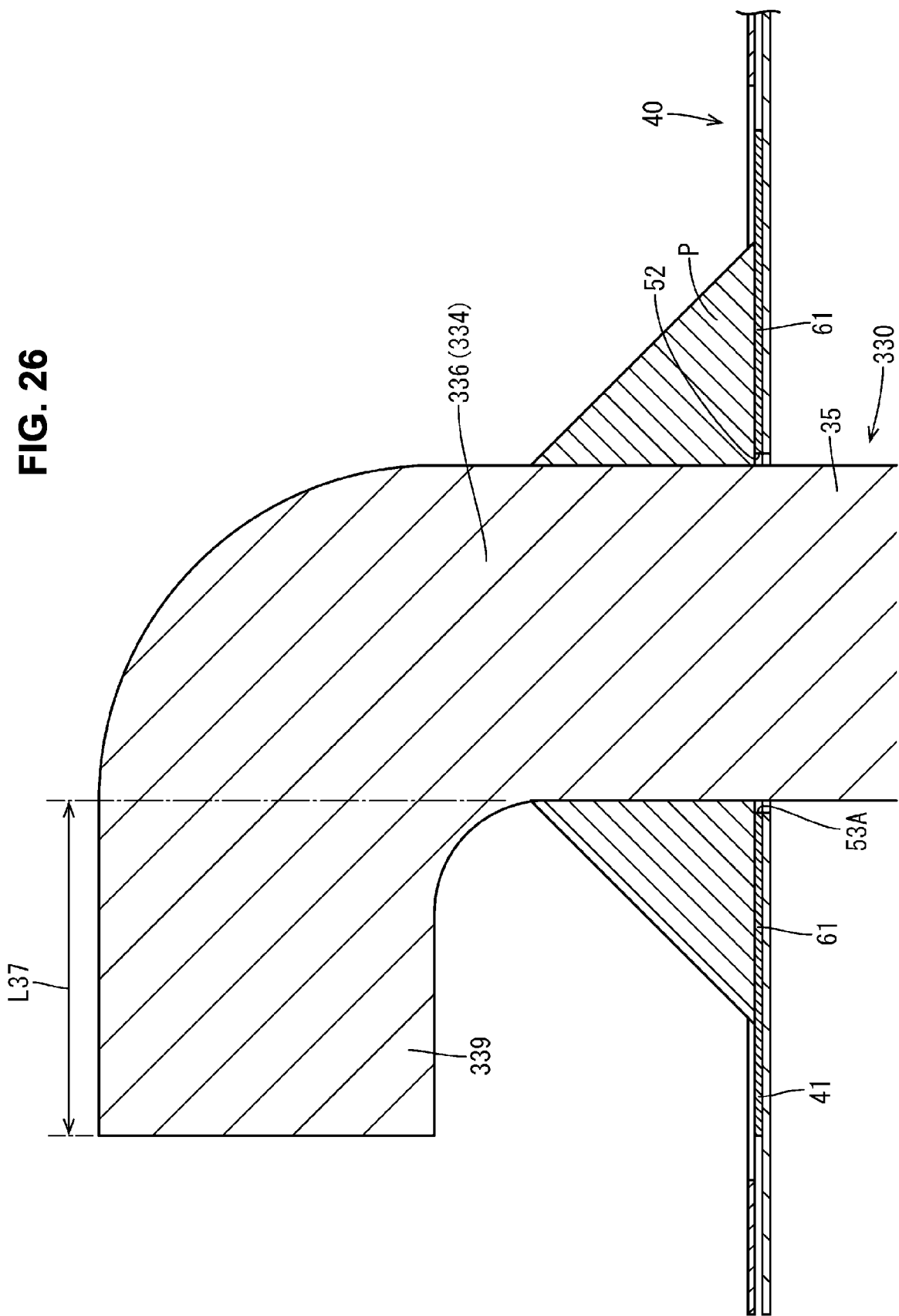
FIG. 26 is a cross-sectional view taken along line C-C in FIG. 25.

As shown in FIGS. 24 to 26, in a connection protruding portion 336 of a connection protruding piece 334 of the conductive member 330 of Embodiment 4, the protruding end is formed as a protruding locking piece 339 (an example of an "engagement portion") that protrudes toward the main body portion 33 side.

The protruding locking piece 339 is formed by striking the protruding end of the connection protruding portion 336, for example, and a protruding amount L37 of the protruding locking piece 339 is substantially the same as the thickness of the connection protruding piece 334.

Accordingly, when each connection protruding portion 336 is moved into the entrance opening 52 from the inlet opening 51 by sliding the FPC 40 rearward, the side-edge portion 53A of the entrance opening 52 on the main body portion 33 side is fitted between the extension portion 33A of the conductive member 330 and the protruding locking piece 339 of the connection protruding portion 336 through recess-projection fitting as shown in FIG. 26. That is, when the connection protruding portion 336 is moved into the entrance opening 52, the side-edge portion 53A of the entrance opening 52 in the FPC 40 and the protruding locking piece 339 are locked to each other in the vertical direction, which is the direction in which the connection protruding portion 336 protrudes. Thereby, the connection protruding portion 336 is prevented from dislodging upward from the entrance opening 52. Accordingly, the connection protruding portion 336 of the conductive member 330 can be connected to the two side-edge lands 61 in the FPC 40 via the solder P without causing positional misalignments thereof in the vertical direction and the left-right direction.

Other Embodiments

The technology disclosed in this specification is not limited to the embodiments described in the description above and the drawings, and for example, various embodiments below are also included.

(1) In the embodiments above, the protruding portions are formed in a rectangular parallelepiped shape. However, there is no limitation thereto, and the protruding portions may also be formed in a columnar shape or a polygonal columnar shape.

(2) In the embodiments above, the configuration is employed in which all of the joining portions 45 to be connected to the connection protruding portions 36 of the conductive members 30 that are connected to the electrode terminals 22 on the right side of the power storage elements 21 and the joining portions 45 to be connected to the connection protruding portions 36 of the conductive members 30 that are connected to the electrode terminals 22 on the left side of the power storage elements 21 are formed in the FPC 40. However, there is no limitation thereto, and a configuration may also be employed in which an FPC main body is divided in the left-right direction, and an FPC provided with joining portions to be connected to only the protruding portions of the conductive members that are connected to the electrode terminals on one side in the left-right direction of the power storage elements is formed.

(3) In the embodiments above, the configuration is employed in which the inlet openings 51 are formed in a substantially rectangular shape in a plan view. However, there is no limitation thereto, and the inlet openings may also be formed in a circular shape or an elliptical shape.

(4) In the embodiments above, the configuration is employed in which the opening edge 50A of each insertion opening 50 is continuous. However, there is no limitation thereto, and a configuration may also be employed in which the opening edge is not continuous, such as a configuration in which the insertion opening is open in the side portion of the FPC, as long as the surface on the power storage element side of the joining portion is reinforced by attaching a metal plate or the like thereto.

LIST OF REFERENCE NUMERALS

20: Power storage element group
21: Power storage element
22: Electrode terminal
30, 230: Conductive member
33: Main body portion
36: Connection protruding portion (example of "protruding portion")
40: Flexible printed circuit
42: Conductive path
50: Insertion opening
51: Inlet opening
52: Entrance opening
53: Edge portion of entrance opening
60: Land
61: Side-edge land
70: Alignment member
71L: Second holding member (example of "second alignment member")
71R: First holding member (example of "first alignment member")
238A: Engagement portion
339: Protruding locking piece (example of "engagement portion")
L3: Maximum tolerance of dimension between protruding portions
L4: Length in extension direction of protruding portion
L5: Opening width
L6: Length in orthogonal direction of protruding portion
L21: Maximum tolerance of dimensions of first alignment member and second alignment member
M, M1: Power storage module
WM: Wiring module

The invention claimed is:

1. A flexible printed circuit with a plurality of conductive paths to which protruding portions protruding from conductive members to be connected to electrode terminals of power storage elements are to be connected, the flexible printed circuit comprising:
a plurality of inlet openings that are larger in size than external shapes of the protruding portions and into which the protruding portions can be inserted with a gap being formed around each protruding portion; and
a plurality of entrance openings that are provided corresponding to the inlet openings, have a configuration in which the protruding portions can be moved thereinto from the inlet openings, are narrower than the inlet openings, and extend in a plate-face direction of the flexible printed circuit,
wherein each of the conductive paths includes a land that is located at an edge portion of the entrance opening and to which the protruding portion is to be connected.

2. The flexible printed circuit according to claim 1, wherein the plurality of entrance openings extend in the same direction from the inlet openings, and thereby all extension directions of the entrance openings are the same.

3. The flexible printed circuit according to claim 2, wherein the lands extend in the extension directions of the entrance openings.

4. The flexible printed circuit according to claim 3, wherein a length in an extension direction of each of the lands is set to be larger than a sum of the maximum tolerance of a dimension between the protruding portions adjacent to each other and a length in an extension direction of the protruding portion.

5. The flexible printed circuit according to claim 1, wherein an opening width of each of the entrance openings in an orthogonal direction that is orthogonal to the extension direction of the entrance opening is equal to a length in the orthogonal direction of the protruding portion.

6. A wiring member comprising:
a plurality of conductive members that each include a main body portion to be connected to an electrode terminal of a power storage element; and
a flexible printed circuit including a plurality of conductive paths to which the conductive members can be connected,
wherein each of the conductive members includes a protruding portion that protrudes from the main body portion,
the flexible printed circuit includes:
a plurality of inlet openings that are larger in size than external shapes of the protruding portions and into which the protruding portions can be inserted with a gap being formed around each protruding portion; and
a plurality of entrance openings that are provided corresponding to the inlet openings, have a configuration in which the protruding portions can be moved thereinto from the inlet openings, are narrower than the inlet openings, and extend in a plate-face direction of the flexible printed circuit, and each of the conductive paths includes a land that is located at an edge portion of the entrance opening and to which the protruding portion can be connected.

7. The wiring member according to claim 6,
wherein the main body portions are connected to the electrode terminals in a state in which the plurality of the conductive members are lined up, and the plurality of entrance openings extend from the inlet openings in the same direction, and thereby extension directions of the entrance openings are the same as a direction in which the plurality of conductive members are lined up.

8. The wiring member according to claim 7, wherein the lands extend in the extension directions of the entrance openings.

9. The wiring member according to claim 8, wherein a length in an extension direction of each of the lands is set to be larger than a sum of the maximum tolerance of dimensions between the plurality of conductive members and a length in an extension direction of the protruding portion.

10. The wiring member according to claim 6, wherein an insertion opening constituted by the entrance opening and the inlet opening is an opening whose opening edge is continuous.

11. The wiring member according to claim 6, wherein an opening width of each of the entrance openings in an orthogonal direction that is orthogonal to the extension direction of the entrance opening is equal to a length in the orthogonal direction of the protruding portion.

12. The wiring member according to claim 6, wherein each of the protruding portions includes an engagement portion that can be fitted to an edge portion of the entrance opening through recess-projection fitting to be locked to the edge portion in a protruding direction.

13. A power storage module comprising:
a power storage element group in which a plurality of power storage elements are lined up; and
the wiring member according to claim 6.

14. A wiring module to be attached to a power storage element group in which a plurality of power storage elements each including two electrode terminals are lined up, the wiring module comprising:
a plurality of conductive members that each include a main body portion to be connected to the electrode terminal of the power storage element, and a protruding portion that protrudes from the main body portion;
a flexible printed circuit including a plurality of conductive paths to which the conductive members are connected; and an alignment member for lining up the plurality of conductive members in a direction in which the power storage elements are lined up, and holding the conductive members,
wherein the flexible printed circuit includes:
inlet openings that are larger in size than external shapes of the protruding portions and into which the protruding portions can be inserted with a gap being formed around each protruding portion; and
entrance openings that are provided in communication with the inlet openings, have a configuration in which the protruding portions inserted into the inlet openings can be moved thereinto, are narrower than the inlet openings, and extend in a plate-face direction of the flexible printed circuit, and each of the conductive paths includes a land that is located at an edge portion of the entrance opening and to which the protruding portion is connected.

15. The wiring module according to claim 14, wherein the plurality of entrance openings extend in the same direction from the inlet openings, and thereby all extension directions of the entrance openings are the same.

16. The wiring module according to claim 15, wherein the lands extend in the extension directions of the entrance openings.

17. The wiring module according to claim 16,
wherein the alignment member includes: a first alignment member for lining up the conductive members that connect the electrode terminals located on one of two sides and holding the conductive members; and a second alignment member for lining up the conductive members that connect the electrode terminals on the other of the two sides and holding the conductive members, and
a length in an extension direction of each of the lands is set to be larger than a sum of the maximum tolerance of dimensions of the first alignment member and the second alignment member in a direction in which the power storage elements are lined up, and a length in an extension direction of the protruding portion.

18. The wiring module according to claim 14, wherein an insertion opening constituted by the entrance opening and the inlet opening is an opening whose opening edge is continuous.

19. The wiring module according to claim 14, wherein an opening width of each of the entrance openings in an orthogonal direction that is orthogonal to the extension direction of the entrance opening is equal to a length in the orthogonal direction of the protruding portion.

20. The wiring module according to claim 14, wherein each of the protruding portions includes an engagement portion that can be fitted to an edge portion of the entrance opening through recess-projection fitting to be locked to the edge portion in a protruding direction.

* * * * *